United States Patent
Kimura et al.

(10) Patent No.: US 6,440,780 B1
(45) Date of Patent: Aug. 27, 2002

(54) METHOD OF LAYOUT FOR LSI

(75) Inventors: Fumihiro Kimura, Nara; Takahiro Ichinomiya, Takatsuki, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/613,526

(22) Filed: Jul. 10, 2000

(30) Foreign Application Priority Data

Jul. 12, 1999 (JP) .............................. 11-197560

(51) Int. Cl.[7] .......................... H01L 21/77; G06F 17/50
(52) U.S. Cl. ............................. 438/129; 716/6; 716/12
(58) Field of Search .................... 438/128, 129; 716/1, 2, 3, 4, 5, 6, 7, 8, 9, 10, 11, 12, 13, 14; 326/93

(56) References Cited

U.S. PATENT DOCUMENTS 5,798,935 A * 8/1998 Doreswamy et al. .......... 716/6
6,020,774 A * 2/2000 Chiu et al. .................. 327/295

FOREIGN PATENT DOCUMENTS

| JP | 10-308450 | * | 11/1998 |
| JP | 10308450 | | 11/1998 |
| JP | 11119853 | | 4/1999 |
| JP | 11-119853 | * | 4/1999 |

OTHER PUBLICATIONS

Ren–Song Tsay, "An Exact Zero–Skew Clock Routing Algorithm," IEEE Transactions of Computer–Aided Design of integrated Circuits and Systems, vol. 12, No. 2, Feb. 1993, pp. 242–249.

* cited by examiner

Primary Examiner—Michael Sherry
Assistant Examiner—Evan Pert
(74) Attorney, Agent, or Firm—Stevens, Davis, Miller & Mosher, LLP

(57) ABSTRACT

The layout method of a semiconductor integrated circuit device according to the present invention includes a net list modification process for adding a cell to a flip-flop group directly connected to the clock source, a process for generating gated circuit division information which allocates the division number of the gated circuit and the drive ability of the cell so that the drive ability of the cell is selected and the delay value becomes uniform, a gated circuit division process for forming a cluster by dividing each of the gated circuits through clustering, a gated cell division process for allocating to each cluster the same number of gated cells as that of the formed clusters and a gated cell front stage CTS process in order to reduce the skew of the clock signal from the clock source via the gated cell to the flip-flop and to control the power consumption of the clock signal part.

20 Claims, 40 Drawing Sheets

F I G. 5
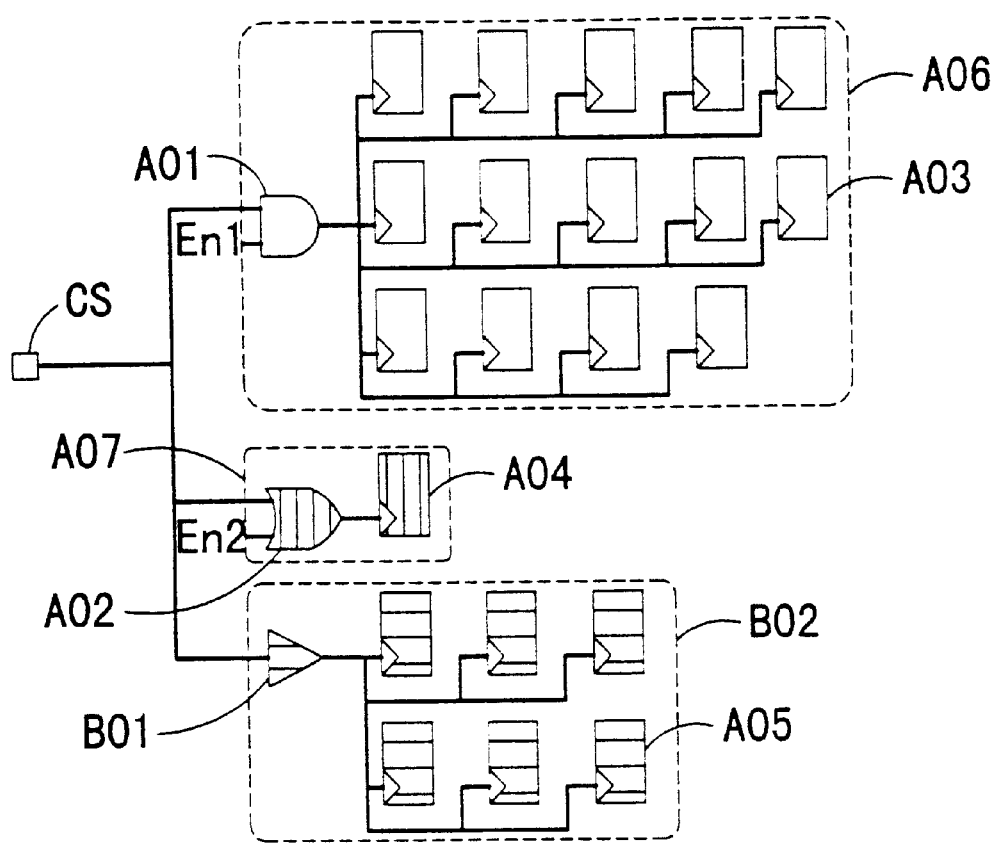

FIG. 8
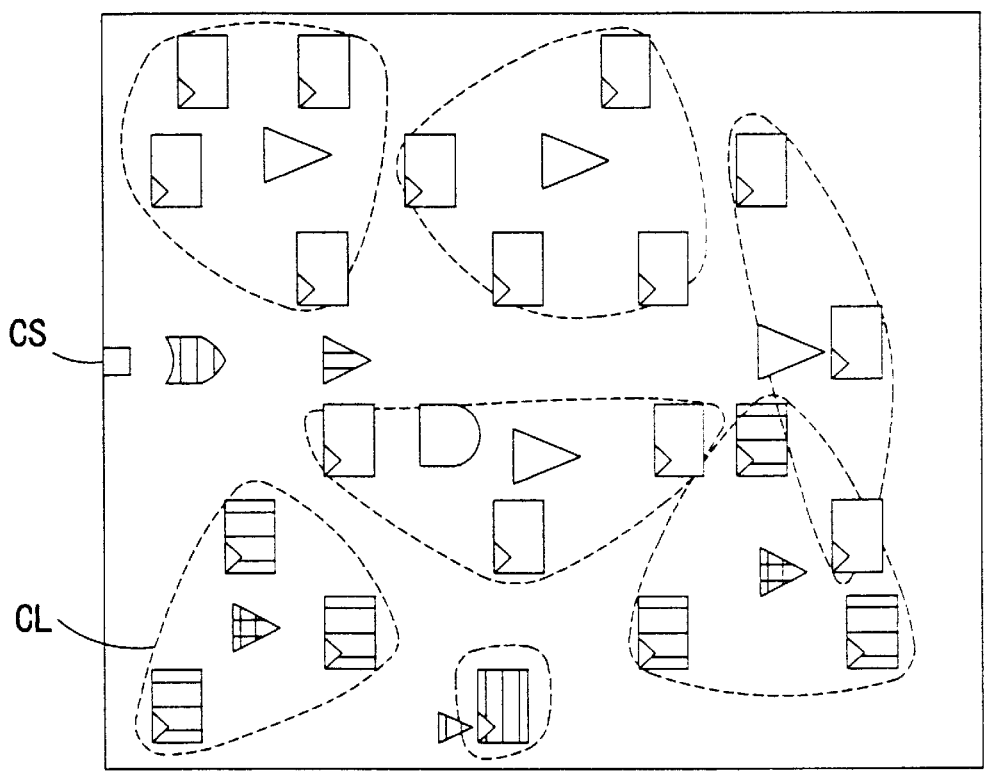
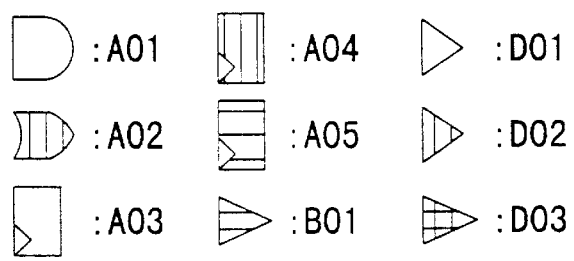

F I G. 1 3
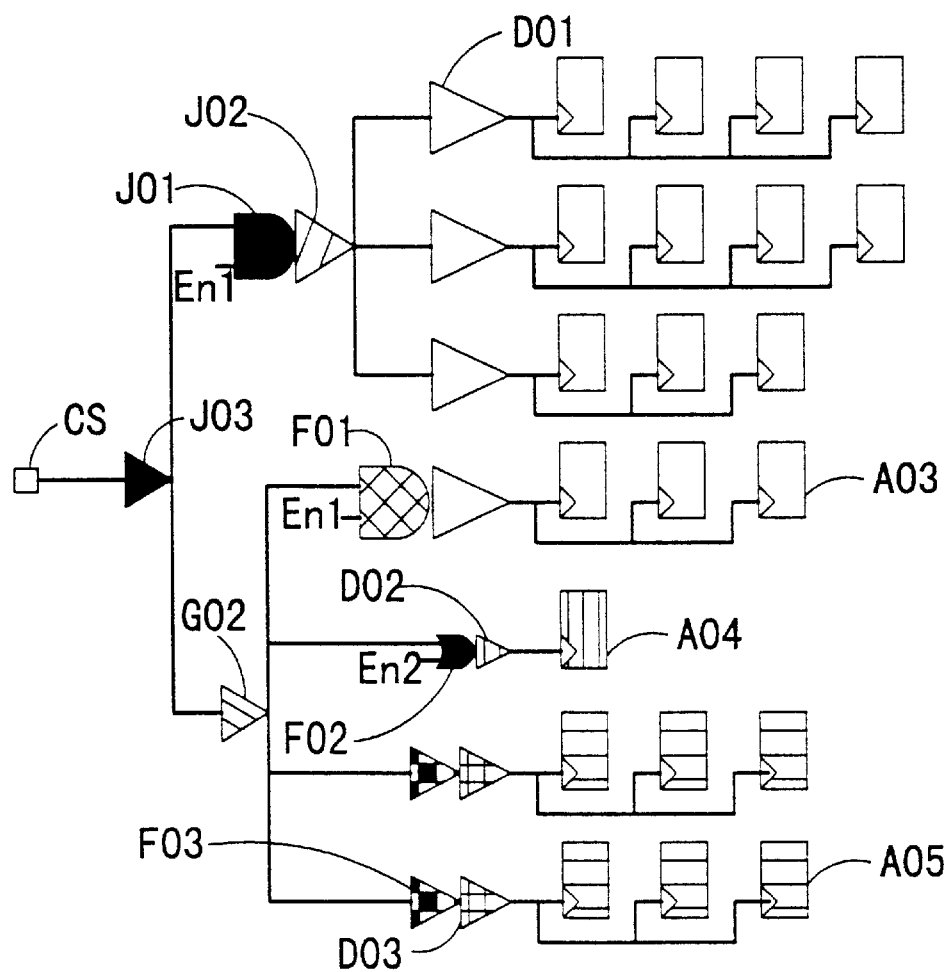

FIG. 14
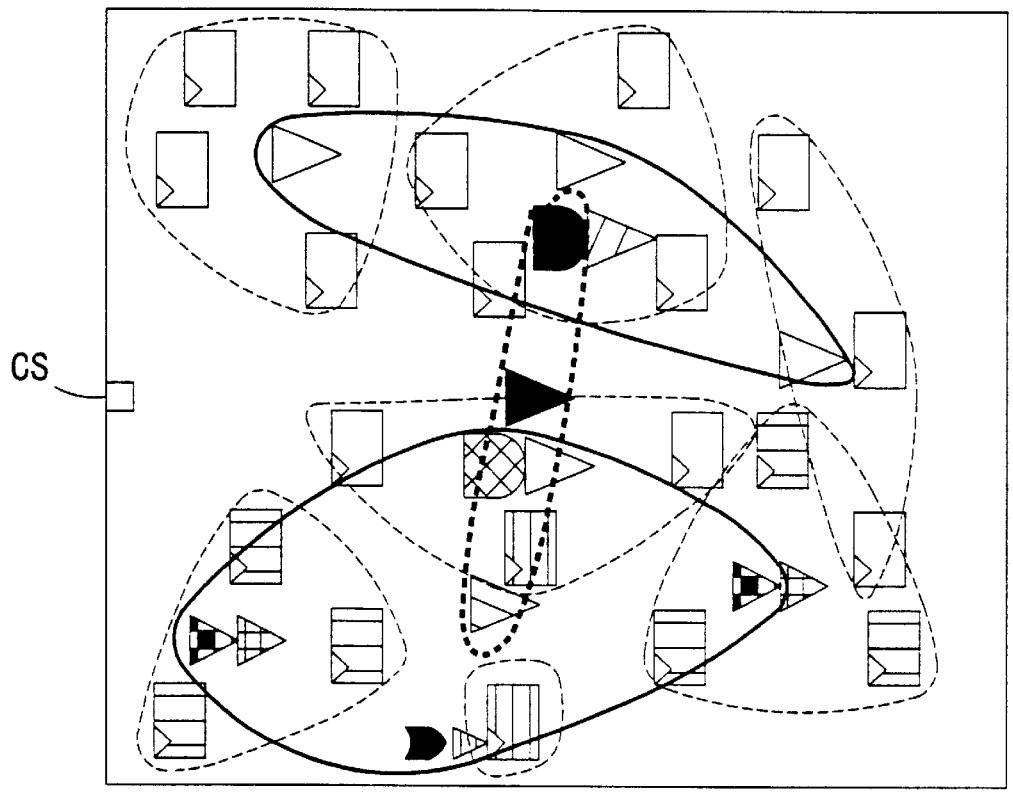
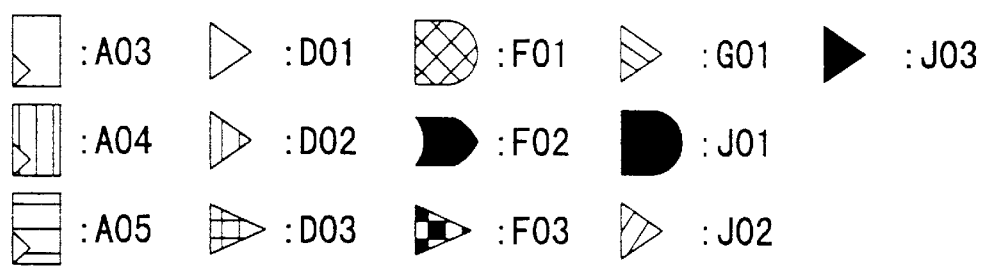

F I G. 1 5
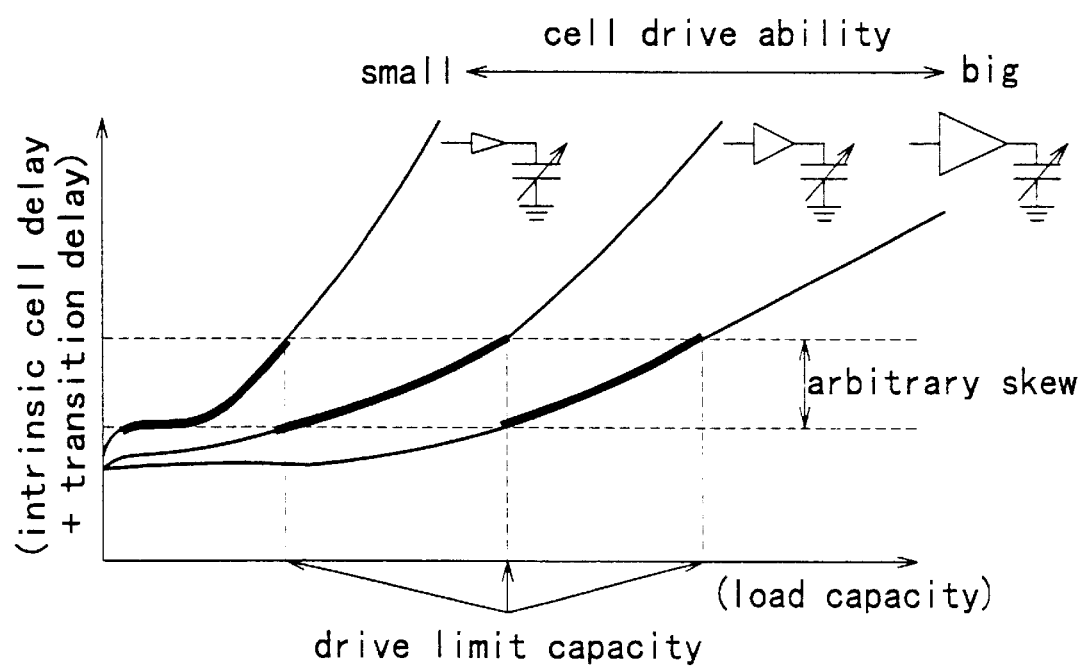

▢ : AA01   ▷ : AB01
▯ : AA02   ▶ : AB02
▤ : AA03

FIG. 38
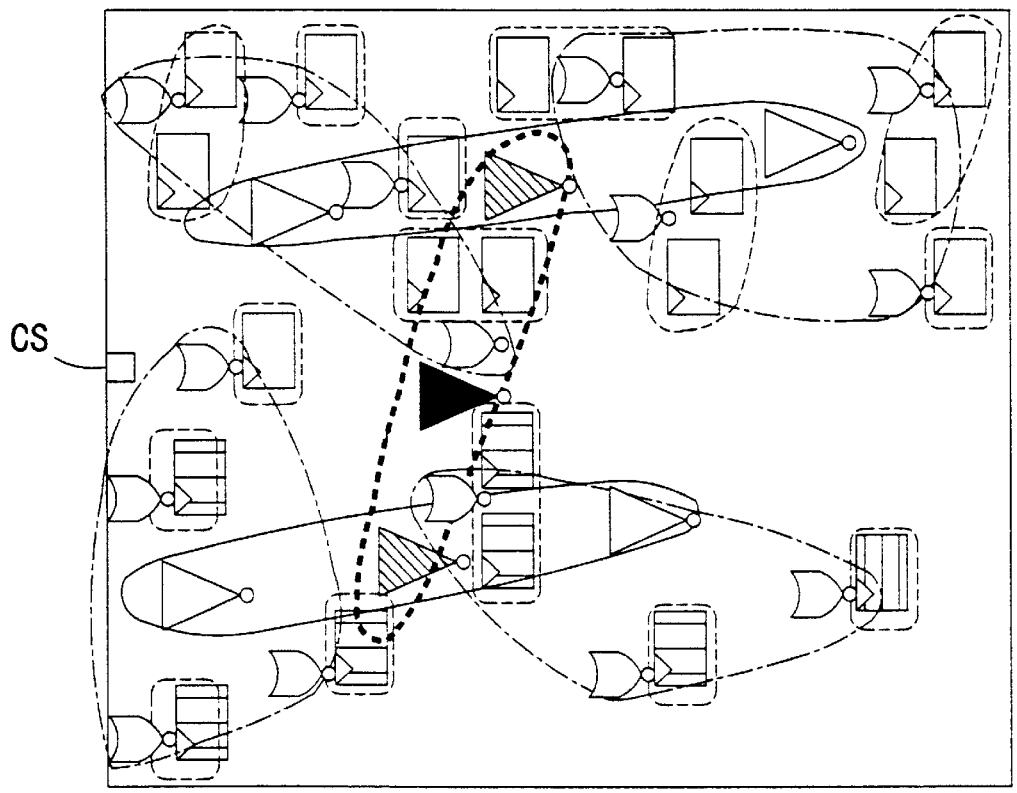
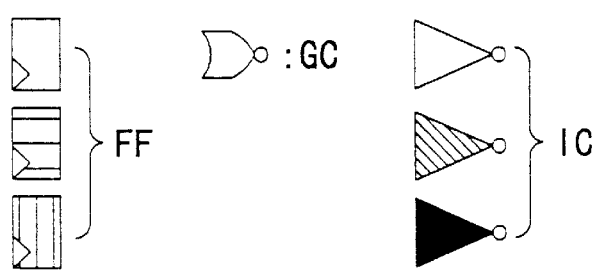

FIG. 40
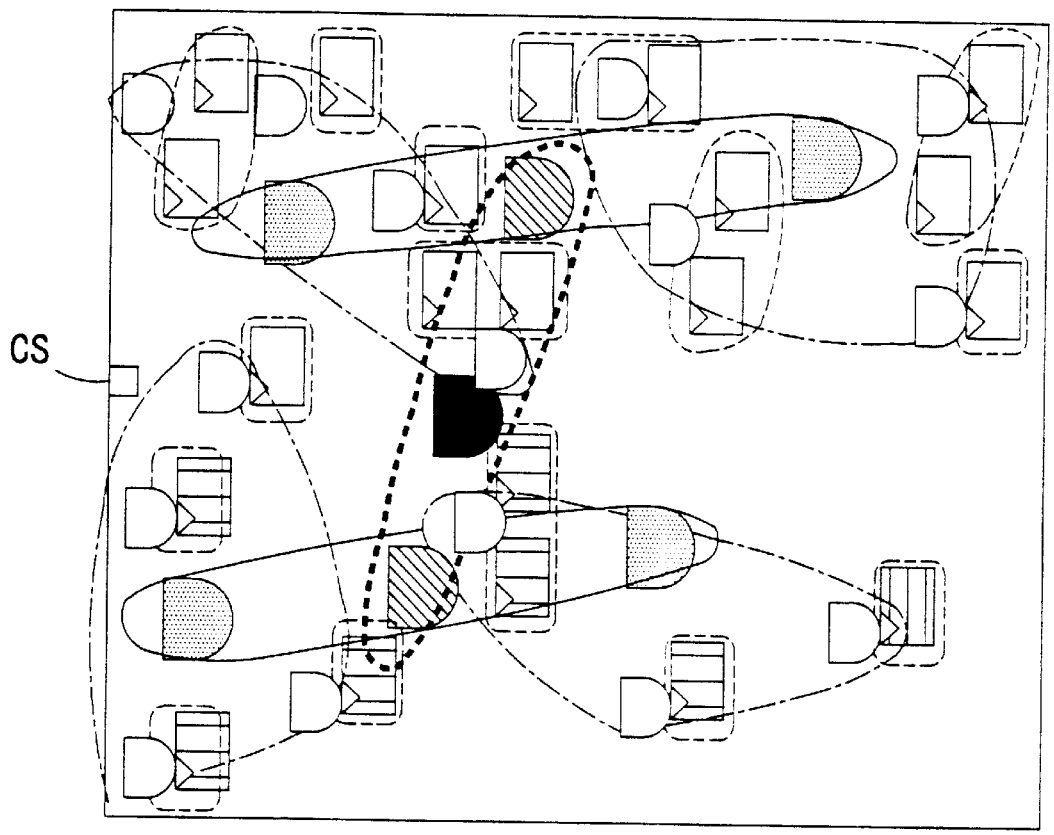
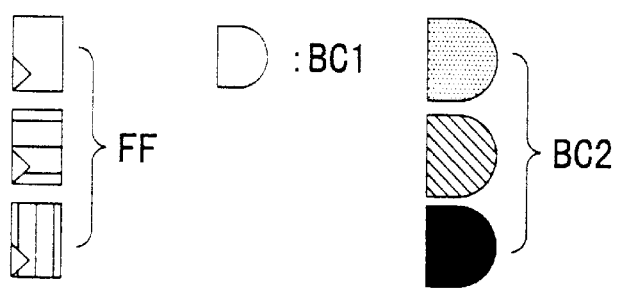

METHOD OF LAYOUT FOR LSI

BACKGROUND OF THE INVENTION

1. Field of the Invention

The present invention relates to a layout design method of a semiconductor integrated circuit device with low power consumption, in particular, to a layout method of a semiconductor integrated circuit device having a gated clock circuit.

2. Description of Related Arts

Semiconductor integrated circuit devices, which have recently been increasing in scale and progressing to enable faster speeds, are generally designed as a clock synchronization circuit, of which the power consumption has been increased at the clock signal part. As a method which is effective to reduce the power consumption of the clock signal part, a gated clock circuit method has been proposed.

As shown in FIG. 33A, a conventional clock circuit has a flip-flop FF connected directly to a clock source CS. Contrary to this, as shown in FIG. 33B, a gated clock circuit has a gated cell (hereinafter referred to as a "gated cell") GC which has, as an input, at least a control signal for controlling the supply of a clock signal (hereinafter referred to as an "enabling signal") and a clock signal, between the clock source CS and the flip-flop FF, for the purpose of stopping the supply of the clock signal to the flip-flop FF which doesn't operate under intended conditions. And the number of the flip-flops FF which can be controlled by each gated cell GC of the gated clock circuit becomes inconstant due to differences depending on the circuit. Here, the gated circuit GX is a circuit where the gated cell GC and the flip-flop FF connected to this gated cell GC are integrated.

On the other hand, in a semiconductor integrated circuit device for clock synchronization, in the case that the delay time difference of clock signals between flip-flops to which the clock signals are supplied (hereinafter referred to as "skew") is large, the problem occurs that the semiconductor integrated circuit device doesn't operate or operates incorrectly.

Therefore, in a conventional clock circuit as shown in FIG. 33A, a layout method of a semiconductor integrated circuit device referred to as a "clock tree synthesis system" (hereinafter abbreviated as "CTS") is widely used in order to generally reduce the skew of the clock signal. For example, as a layout method of the semiconductor integrated circuit device of a "clock tree synthesis system," "An Exact Zero-Skew Clock Routing Algorithm" (IEEE Trans. Computer-Aided Design, vol. 12 no. 2, pp. 242–249, February 1993) is proposed.

A layout method of the semiconductor integrated circuit device of a "clock tree synthesis system," is described with respect to FIG. 34A showing the placement result of the clock circuit in FIG. 33A.

The layout method of the semiconductor integrated circuit device of the "clock tree synthesis system" has the purpose of implementing a circuit wherein the delay time from the clock source CS to each flip-flop FF becomes minimum and the skew becomes minimum. Therefore, based on the placement result of the flip-flop FF belonging to a clock net, a clustering is performed for division into a plurality of clusters CL surrounded by thin lines in FIG. 34B by utilizing an evaluation function wherein the sum of "an input capacitance of the flip-flop" forming each cluster and "a wire capacitance between flip-flops estimated according to the routing algorithm" is uniform and the sum of the entire capacitance of clusters becomes minimum. Then a buffer cell AGO1 is inserted, which is a cell that is driven without changing its logic, into a position, for example the center or the center of the gravity of the cluster CL, where the load capacitance (including the wire capacitance) of each flip-flop FF belonging to the cluster CL, for the purpose of reducing the delay time of the clock and the skew.

Clustering is carried out, for example, as follows. Initial clusters are formed of a plurality of clusters divided by repeating the division processing into halves with respect to the flip-flop to which a clock signal should be supplied in the same way as to a conventional cluster. Next, two arbitrary clusters are selected from the initial two clusters and one arbitrary cell belonging to each of the selected clusters is selected, respectively, and interchanged with each other. In the case that the clusters resulting from the interchange satisfy the evaluation function where the sum of "an input capacitance of the flip-flop" forming each cluster and "a wire capacitance between flip-flops estimated according to the wire algorithm" is uniform and the sum of the capacities of the whole cluster become minimum, the condition where the interchange of the cells has been carried out is maintained, while in the case that the evaluation function is not satisfied, the cells are returned to the original clusters. The desired clusters can be gained by sufficiently repeating the process of clustering by using simulated annealing or the like in order to avoid the influence, or the minimum solution, of the initial clusters. The placement result after clustering is shown in FIG. 34B.

Next, clustering and buffer insertion processing are carried out repeatedly in the same way as above to the inserted buffer cells. The placement result of carrying out clustering to the inserted buffer cells AGO1 is shown in FIG. 34C. The reference symbol AGO2 denotes a buffer cell inserted at the time of clustering of the buffer cell AGO1.

A hierarchical tree referred to as a clock tree is generated according to the above processes. A clock circuit gained by performing a layout method of the semiconductor integrated circuit device of the "clock tree system" to the clock circuit in FIG. 33A is shown in FIG. 35.

Then after routing is performed to the generated clock tree so that the wire length for each cluster becomes uniform, the entire routing except for the clock tree is completed according to the net list.

By performing the clustering processing and the routing processing described above the skew of the clock signals from the clock source CS to each of the flip-flops FF is reduced.

In the case that the "clock tree system" layout method of the semiconductor integrated circuit device according to the prior art is applied to the gated clock circuit, however, the skew between respective flip-flops cannot be reduced from the clock source via the gated cell though the skew between respective, gated cells can be reduced from the clock source.

Therefore, as a method for reducing the skew of the clock signal of the gated clock circuit, a method disclosed in, for example, the Japanese unexamined patent publication H10 (1998)-308450 or the Japanese unexamined patent publication H11 (1999)-119853 has been proposed. In comparison to the circuit of FIG. 36 showing a gated clock circuit, a circuit implementing a method in the Japanese patent publication H10 (1998)-308456 is shown in FIG. 7 while the result of clock tree insertion is shown in FIG. 38. The reference symbols En1 and En2 show enabling signals which are added to the gated cell GC in FIGS. 36, 37 and 38. The reference symbol IC denotes an inverter cell.

In the method of the Japanese unexamined patent publication H10 (1998)-308450, a placement region for a circuit GX (hereinafter referred to as a "gated circuit") comprising each gated cell GC of the gated clock circuit and a flip-flop FF connected to each gated cell GC are designated for the placement where gated cells GC forming the gated circuit and the flip-flop FF are united in one place. Next, for each gated circuit GX, clustering is carried out so that the load capacities of the whole cluster become uniform in the same way as the clustering for a layout method of the semiconductor integrated circuit device of the conventional "clock tree system" for the division into a plurality of clusters. Then the same number of gated cells GC as the number of clusters gained through division are inserted into the geometric center of each cluster. The inserted gated cell GC is connected to the same enabling signal that the gated cell GC is connected to before the gated circuit is divided. At this stage, the delay value from the gated cell GC to each flip-flop FF becomes uniform. Next, routing is carried out, to a part ranging from the clock source CS to each gated cell GC, by generating a hierarchical tree in the same way as the "clock tree system" of the layout method of the semiconductor integrated circuit device according to the above described prior art.

Through the above processing the skew of the clock signal from the clock source CS via the gated cell GC to each flip-flop FF is reduced.

After implementing the method of the Japanese unexamined patent publication H10 (1998)-308450 the circuit has the following characteristics. That is to say, a buffer cell (an inverter cell IC) inserted into the same stage of the clock tree and the gated cell GC have the same logic and the same drive ability respectively. The gated cell GC is inserted only between the buffer cell (inverter cell IC) at the final stage of the clock tree and the flip-flop FF.

A circuit which has implemented the method of the Japanese unexamined patent publication H11 (1999)-119853 to the circuit of FIG. 36 showing the gated clock circuit is shown in FIG. 39 and the result of the clock tree insertion is shown in FIG. 40.

According to a method of the Japanese unexamined patent publication H11 (1999)-119853, clustering is first carried out so that the load capacitance between clusters becomes uniform and the sum for the load capacitors of the clusters becomes minimum in the same way as the clustering in the "clock tree system" of the layout method of the semiconductor integrated circuit device according to a prior art for each gated circuit for the division into a plurality of clusters, and the same number of enabling buffer cells BC1 as the number of clusters gained through the division are inserted into the geometric center for each cluster. The enabling buffer cells BC1 are the dedicated cells used in the method of the Japanese unexamined patent publication H11 (1999)-119853 which has the same logic structure as that of the gated cell in the gated circuit before division.

At this time the inserted enabling buffer cells BC1 are respectively connected to the same enabling system as that of the gated cells to which the gated circuit is connected before division.

At this stage, the delay time from each enabling buffer cell BC1 to flip-flop FF becomes uniform, therefore, routing is carried out by producing a hierarchical tree in the same way as the "clock tree system" of the layer method of the semiconductor integrated circuit device according to the above described prior art for each enabling buffer cell BC1 from the clock source CS. By doing this, the skew of the clock signal from the clock source CS via the gated cell GC to each flip-flop FF can be reduced. The reference symbol BC2 is an enabling buffer cell inserted at the time when the tree is generated.

At the time of the clock tree generation, according to a method of the Japanese unexamined patent publication H11 (1999)-119853, an enabling buffer cell is inserted instead of the buffer cell and other input terminals, then the ones connected to the clock signals among the input terminals of the enabling buffer cells, are fixed to the power source net.

Next, the connection of the input terminal of the enabling buffer cell BC2 inserted into a cluster comprising only an enabling buffer cell BC1, which has the same input, and the connection of the input terminals of the enabling buffer cell BC1 belonging to the cluster, are switched.

By carrying out the above described processing the skew of the clock signal from the clock source via the gated cell to each flip-flop is reduced and the power supply consumed at the gated circuit is reduced.

After implementing the method of the Japanese unexamined patent publication H11 (1999)-119853 the circuit has the following characteristics. That is to say, the enabling buffer cells that are inserted into the same stage of the clock tree are, respectively, the cells with the same logic and the same drive ability. There is a process for interchanging the connection parts of the enabling buffer cells and the enabling signals, wherein a dedicated cell, which is an enabling buffer cell, is employed.

According to a conventional layout method of the gated clock circuit shown in the Japanese unexamined patent publication H10 (1998)-308450 and the Japanese un examined patent publication H11 (1999)-119853, clustering should be carried out in accordance with a cluster of which the load capacitance when driving with the gated cell becomes the minimum, that is to say, the load capacitance value of the gated circuit in order to reduce the skew because a gated cell, with the same logic and the same drive ability, is inserted.

Accordingly the division number of the gated circuit increases because of the inconsistency of the number of flip-flops in the gated circuit, and since the number of stages of the clock tree for the gated clock circuit and the number of inserted buffers, as well as the number of gated cells, increase, the delay value or the skew increase from the clock source to the flip-flop.

In the method of the Japanese unexamined patent publication H11 (1998)-308450 a placement region is designated for each gated circuit and there occurs an area increase and timing limit violation of the logic circuit.

In addition since the gated cell is inserted only between the buffer cell of the last stage of the clock tree and the flip-flop there occurs the problem that the power supply is always consumed since the buffer cell and the gated cell from the clock source to the flip flop always operate even when an enabling signal occurs for stopping the gated cell.

On the other hand, in the method of the Japanese unexamined patent publication H11 (1999)-119853, an enabling buffer cell, which is a dedicated cell, is necessary. The enabling buffer cell has a circuit structure where at least a gated cell and a buffer cell are combined, therefore, power consumption increases compared to a method where a buffer cell is used for the clock tree.

According to the method of the Japanese unexamined patent publication H11 (1999)-119853, after division of each gated circuit, clusters are formed in the same way as the above described conventional "clock tree system" of the layout method of the semiconductor integrated circuit device for the clock net from the clock source to each gated cell after division. In a conventional clustering method, gated cells belonging to the clock net are all treated equally, irrespective of the kinds of the enabling signal, which puts a priority on the cluster where the sum of the "input capacitance of the flip-flop" forming each cluster and the "wire capacitance between flip-flops estimated according to the wire algorithm" becomes uniform. Therefore, it is difficult to generate clusters comprising only the gated cells having the same input. And it difficult for the clusters comprising only the gated cells having the same input to be generated unless the placement range is designated for the flip-flop belonging to each gated circuit and unless a gated cell with the same input is arranged close by after the division of the gated circuit.

However, when the placement region is designated for each gated circuit, the problem occurs that the area increases and a timing limit violation of the logic circuit occurs. In addition, when a circuit modification is generated to a cell with a larger drive ability so as to satisfy the timing between flip-flops, the area and the power consumption further increase.

Conventional clustering has the purpose that the delay time from the clock source to the flip-flop becomes minimum and the skew becomes uniform, and uses an evaluation function where the capacitance of each cluster is uniform and the sum of the capacities of the whole cluster becomes the minimum, therefore, the problem occurs that clusters do not necessary comprise only the gated cells with the same input when the placement region of the flip-flop belonging to the gated circuit is designated.

SUMMARY OF THE INVENTION

Reviewing the above described problems, it is the purpose of the present invention to provide a layout method of a semiconductor integrated circuit device which can reduce the skew of a clock signal between flip-flops via a gated cell from a clock source and can control the power consumption of the clock signal part.

A layout method of a semiconductor integrated circuit device according to the present invention is a method for designing a layout of a semiconductor integrated circuit device including one gated circuit comprising a group of elements having gated cells connected to clock sources and being connected to clock sources via gated cells, as well as a gated clock circuit having another group of elements connected directly to clock sources. Therefore, the method includes the following processes.

In a net list modification process, since the other group of elements are treated as other gated circuits, the net list of the gated clock circuit is modified to a net structure to which cells for correcting the number of stages are added between the clock sources and the other group of elements.

In the process for generating gated circuit division information, the division number for each gated circuit is determined so that the delay value becomes uniform and the drive ability of the cell for circuit division is allocated for each gated circuit by selecting the drive ability of the cell for circuit division in accordance with the total load capacitance of each gated circuit based on the result of placement according to the net list after modification and/or rough routing.

In the gated circuit division process, each gated circuit is divided to form a plurality of clusters by carrying out clustering based on the information generated at the process for generating gated circuit division information and the cell for a circuit division, which has the drive ability allocated in the process for generating gated circuit division information, is inserted, respectively, into the position where the load capacitance of each cluster becomes uniform.

In the gated cell division process, the same number of gated cells for circuit division as that of clusters are allocated for each gated circuit and the drive ability of the gated cells for circuit division is selected so that the delay value becomes uniform in accordance with an input capacitance of the cell for circuit division, and then each gated cell for circuit division is inserted in the vicinity of each cell for circuit division.

In the gated cell front stage CTS process, a hierarchical tree is generated between the clock source and each gated cell for circuit division in the clock tree system.

According to this method, the skew of the gated clock circuit can be reduced and the division number for the gated circuit can be made small in relation to a conventional layout method of a semiconductor integrated circuit device for the gated clock circuit by positively using the cells with the same logic and different drive abilities, even when the number of elements connected to gated cells, such as flip-flops, becomes inconsistent. That is to say, since the number of stages in the clock tree and the number of buffers between the clock source and the gated cell can be made small, the delay value or the skew from the clock source to the element can be reduced. It is not particularly necessary to designate the placement region for every element connected to each gated cell, therefore, problems such as area increase or timing limit violations of the logic: circuit rarely occur.

In the above described method of the invention, in the case that inputs of the gated cells for circuit division belonging, to the same cluster are formed solely of all the same clock nets after the gated cell front stage CTS process and/or at the time of implementation of the gated cell front stage CTS process, a process for optimizing the gated cell position may be included, which moves the gated cells for circuit division belonging to the same cluster to the front stage of the cells for circuit division positioned on the side of clock source away from the gated cells for circuit division belonging to the same cluster.

According to this method, cells or wires which can stop the operation at the time when a stop signal is inputted to the gated cell for circuit division increase by moving the gated cell for circuit division to the clock source side and, therefore, the power consumption of the gated clock circuit can be reduced.

In the above described method of the invention or in a method of the invention further having a gated cell position optimization process, it is possible to allocate the cell corresponding to an inverter cell as a cell for circuit division, at the time of the process for generating gated circuit division information by replacing the gated cell of the gated clock circuit and the cell for correcting the number of stages inserted at the net list modification process, respectively, with an inverted cell:for inverting logic.

According to this method, since the number of gate stages can be reduced, the delay value and the power consumption from the clock source to the element such as a flip-flop can be reduced.

In the above described method of the invention or in a method of the invention further having a process for optimizing the gated cell position, an upper limit maybe set for the wire capacitance of each cluster as the division condition of each gated circuit at the time of the process for generating gated circuit division information.

According to this method, a skew by routing can be controlled by giving the upper limit to the wire capacitance of the cluster.

In the above described method of the invention or in a method of the invention further having a process for optimizing the gated cell position, an evaluation function may be used where the load capacitance difference between each cluster and the sum of the load capacitance of each cluster satisfy the preset capacitance value, the kinds of attributes of different cells at least forming each cluster are minimum in number and a priority is placed on a cluster of which the number of cells for each attribute forming each cluster at the time of the gated circuit division process and/or clustering in the gated cell front stage CTS process.

According to this method, a cluster formed only by the cells with the same attributes can be effectively generated. For example, in the case of application to the gated clock circuit, since a cluster formed only by the gated cell for circuit division with the same input can be effectively generated, cells or wires which can stop the operation at the time when a stop signal is inputted to the gated cell for circuit division increase.

Therefore, the power consumption in the gated clock circuit can be reduced. In addition, it is not particularly necessary to designate the placement region for every element such as a flip-flop connected to each gated cell for circuit division and, therefore, problems such as area increase or timing limit violations of the logic circuit rarely occur.

In the case where the above described evaluation function is applied to a circuit design method referred to as a useful skew, which makes a circuit design at high speed possible by allowing the element such as a flip-flop to have a plurality of delay times intentionally, a cluster formed only of elements such as flip-flops to which the same delay time is allocated can be generated effectively so as to make it possible to facilitate the adjustment of the clock skew.

It is possible to adjust the drive ability of the cell for circuit division inserted into each cluster in the case that an evaluation function is used where the load capacitance difference between each cluster and the sum of the load capacitance of clusters satisfy the preset capacitance value, the kinds of attributes of different cells at least forming a cluster are minimum in number and a priority is placed on a cluster of which the number of cells for each attribute forming a cluster at the time of clustering is large.

According to this method, the number of cells belonging to the cluster, the increase of the skew due to the placement spread of the cells, or the possibility where cells with different attributes may mix, can be reduced compared to the case where the drive ability of the cell for circuit division inserted into the cluster is not adjusted.

In the above described method of the invention or in a method of the invention further having a process for optimizing the gated cell position, the net structure may be modified, with respect to the gated cell for circuit division which forms the cell for forming the clock tree inserted to each cluster after clustering and each cluster, by using a set of cells which is formed of one or more first cells having the same logic circuit as that of gated cells for circuit division forming each cluster and a second cell for driving without modifying the logic and to which one of the input terminals of the first cells and the input terminal of the second cell are connected.

According to this method, particularly in the case that cells with different attributes mix in the cluster and the majority number of cells forming the cluster is occupied by the cells with one attribute, it becomes possible to move the gated cell for circuit division to the side of the clock source so that the power consumption of the gated clock circuit can further be reduced, even in the case that the gated cell for circuit division can not be moved to the clock source side according to the previous method of the invention.

In the above described method of the invention or in a method of the invention further having a process for optimizing the gated cell position, the net structure may be modified, with respect to the cell for forming the clock tree inserted to each cluster after clustering and the gated cell for circuit division which comprises each cluster, by using a circuit which is formed of one or more first cells having the same logic circuit as the gated cells for circuit division forming each cluster and a second cell for driving without modifying the logic and to which one of the input terminals of the first cells and the input terminal of the second cell are connected.

According to this method, since the positional relationship between one or more first cells having the same logic circuit as the gated cell for circuit division and the second cell for driving without modifying the logic is arbitrary, a gated cell or a buffer cell can be inserted into a position which makes the skew the minimum for every cell of each attribution and, therefore, the skew can further be made smaller compared to the case where they are collected.

In the above described method of the invention or in a method of the invention further having a process for optimizing the gated cell position, a process for optimizing gated cell placement coordinates may exist which adjust the placement coordinates of the gated cell for circuit division after the gated cell division process.

According to this method, the skew from the gated cell to the element can be reduced by optimizing the placement coordinates of the gated cell for circuit division. In addition, the spread of the placement of the gated cell for circuit division can be made smaller according to the optimization of the placement coordinates of the gated cell for circuit division, therefore, the skew from the clock source to the gated cell can be reduced.

In the above described method of the invention or in a method of the invention further having a process for optimizing the gated cell position, in the case of the structure where cells for circuit division which drive without modifying the logic from the gated cell for circuit division or cells for forming the clock tree are connected in series, and/or in the case of the circuit structure where cells for circuit division which drive without modifying the logic and/or two or more cells for forming the clock tree are connected in series, the cells for circuit division which drive without modifying the logic and/or the cells for forming the clock tree may be replaced with feed-through cells or may be reduced within the range where the skew from the clock source to each element of each element group is ranged into a desired skew value.

According to this method, it becomes possible to eliminate a redundant logic circuit forming the clock tree and, therefore, the power consumption of the gated clock circuit can be further reduced.

In the above described method of the invention or in a method of the invention further having a process for optimizing the gated cell position, it is possible to combine all or a part of the above described optional terms. In this case, the effects of each of the combined optional terms are achieved.

BRIEF DESCRIPTION OF THE DRAWINGS

FIG. 5 is a circuit diagram showing a gated clock circuit after the net list modification;

FIG. 8 is a schematic diagram showing the division result of a gated circuit;

FIG. 13 is a circuit diagram showing the gated clock circuit after the gated cell position optimization;

FIG. 14 is a schematic diagram showing the result of the gated cell position optimization;

FIG. 15 is a characteristic diagram showing the changes of the load capacitance and the changes of the cell delay value;

FIG. 38 is a schematic diagram showing the result of implementing a layout method of a semiconductor integrated circuit device to a gated clock circuit according to a prior art;

FIG. 40 is a schematic diagram showing the placement result after implementing a layout method of a semiconductor integrated circuit device to a gated clock circuit according to a prior art.

DESCRIPTION OF THE PREFERRED EMBODIMENTS

First Embodiment Corresponding to claim 1

The first embodiment according to the present invention is described in reference to the drawings.

Figure 1:
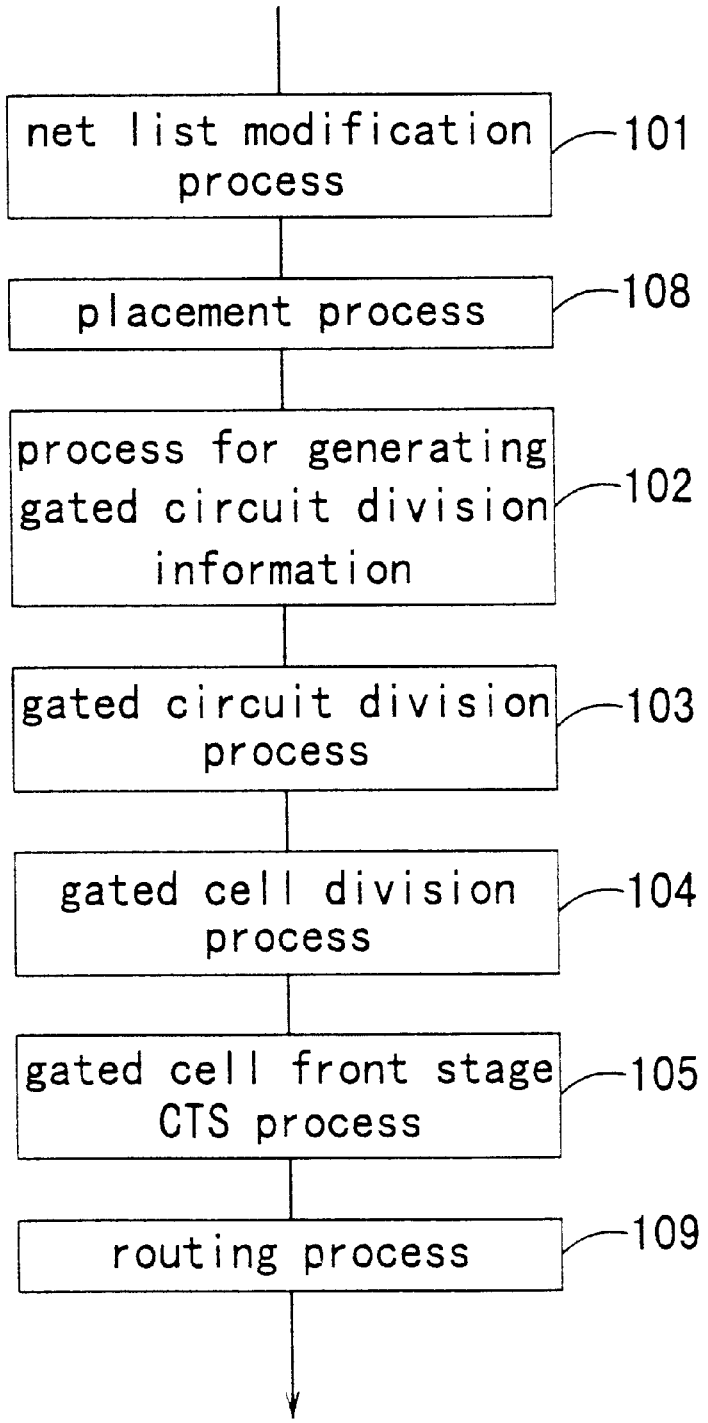
FIG. 1 is a flow chart showing the first embodiment according to the present invention.
Figure 4:
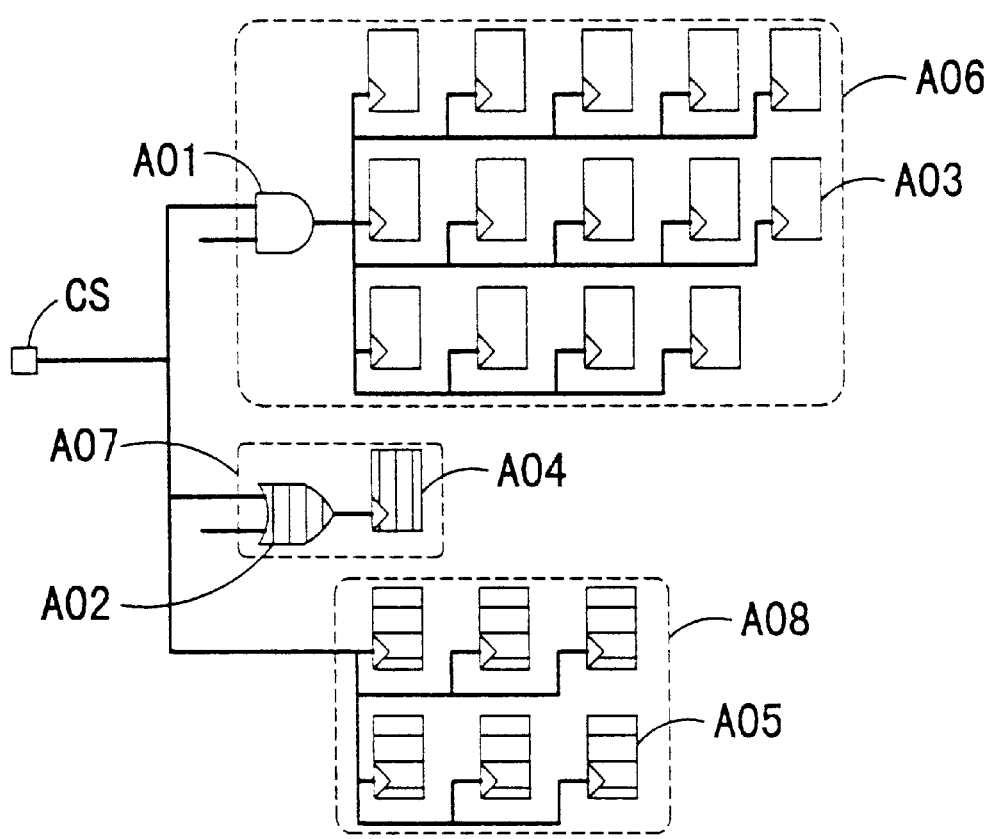
FIG. 4 is a circuit diagram showing a gated clock circuit.

FIG. 1 is a flow chart of a layout method of a semiconductor integrated circuit device according to the first embodiment of the present invention. Using the gated clock circuit shown in FIG. 4, each process of the flow chart shown in FIG. 1 is described. In FIG. 4, the reference symbol CS denotes a clock source, the reference symbols A01, A02 denote a gated cell, the reference symbols A03, –A04, A05 denote a flip-flop which is an element, the reference symbols A06, A07 denote a gated circuit and the reference symbol A08 denotes a flip-flop group which is an element group.

On implementing the present invention, a load capacitance which satisfies an arbitrary skew for every drive ability is found in advance for the gated cell utilized in the gated clock circuit and for the cells inserted for the delay adjustment.

For example, as shown in FIG. 15, a graph is formed for showing the changes of the sum of intrinsic delay and the transition delay for the load capacitance connected to the output terminal of the cell with respect to each cell with the same logic and different drive ability for the gated cells utilized in the gated clock circuit and the cells inserted for the delay adjustment. As shown in FIG. 15 with thick lines, the drive ability of the cell is changed and complemented for the increase of the load capacitance of the cell drives so that the cell drive ability is distributed within the range of an arbitrary skew. Then, the boundary load capacitance (hereinafter cell drive limit capacitance), over which each cell exceeds the upper limit of an arbitrary skew, is found.

In the case when the load capacitance is not continuous, a cell with the same logic which has the driving ability able to complement the uncontinuous part is formed.

In the net list modification process 101, with respect to the flip-flop (A05) group A08 directly connected to the clock; source CS without having the gated cell shown in FIG. 4 in between, the net structure of the gated clock circuit is converted to the net structure where one cell for correcting the number of stages, for example, a buffer cell, is added between the clock source CS and the flip-flop group A08 directly connected to the clock source CS in order to make the number of tree stages the same as other gated circuits A06, A07 and to treat equally as are the other gated circuits A06, A07 A net structure of the gated clock circuit after implementing the net list modification process 101 is shown in FIG. 5. Hereinafter the buffer cell B01 is treated as a gated cell and a circuit formed by flip-flops connected to the buffer cell B01 is treated as a gated circuit B02.

Figure 6:
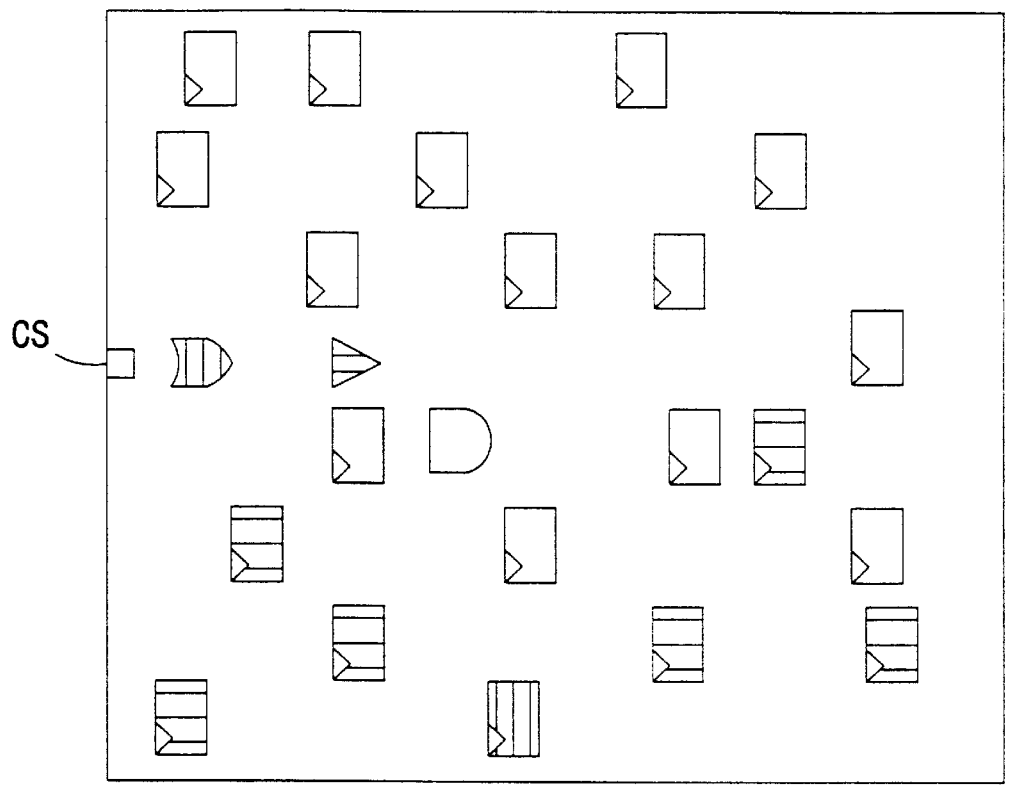
FIG. 6 is a schematic diagram showing the placement result J of the gated clock circuit in FIG. 5.

In the placement process 108, the placement is carried out in accordance with the net list including the gated clock circuit as shown in FIG. 5 in the same way as the placement technology of a conventional layout design. FIG. 6 shows the placement result of the gated clock circuit.

In the process 102 for generating gated circuit division information, a visual wire capacitance between the flip-flops (A03, A04, A05) of the gated circuit is calculated based on the placement result of the placement process 108 for each gated circuit A06, A07, B02, using the algorithm which very precisely estimates the wire length from the placement result, such as the widely known "Steiner tree model." Then, the sum of the calculated visual wire capacitance of the gated circuit A06, A07, B02 and the input capacitance of the flip-flops A03, A04, A05 belonging to the gated circuits A06, A07, B02 is found and the total load capacities of the gated circuits A06, A07, B02 are, respectively, found.

And the division number of the gated circuit and the optimum drive ability of the inserted cell for circuit division are determined from the drive limit capacitance of the cell for circuit division inserted into a cluster at the clustering process of the gated circuit which is carried out in the later process and from the total load capacitance of each of the gated circuits A06, A07, B02. For example, in the case that the total load capacitance of the gated circuit is larger than the drive limit capacitance of the cell which has the same logic as the cell inserted for circuit division and has the largest drive ability, the total load capacitance of the gated circuit is divided by the drive limit capacitance of the cell which has the largest drive ability to find the value rounded up to an integer as a division number of the gated circuit. In addition, the value gained by dividing the total load capacitance of the gated circuit by the found division number is estimated as the total load capacitance of the cluster after clustering so as to allocate the optimum drive ability of the cell inserted for circuit division.

In the first embodiment, the gated circuit A06 is divided into four clusters while the gated circuit A07 is used as one cluster without being divided, then the gated circuit B02 is divided into two clusters and the buffer cell D01 is allocated to the gated circuit A06, the buffer cell D02 is allocated to the gated circuit A07 and the buffer cell D03 is allocated to the gated circuit B02, respectively.

In the gated circuit division process 103, based on information generated in the process 102 for generating gated circuit division information, clustering (division of the gated circuit) is carried out in the same way as the clustering carried out through the layout method of a semiconductor integrated circuit device of a "clock tree system" according to the above described prior art for each of the gated circuits A06, A07, B02 and the buffer cells D01, D02, D03 which have the optimum drive ability allocated, in the process 102 for generating gated circuit division information, to positions where the load capacitance of the cluster comprising the divided gated circuit is uniform are, respectively, inserted as the cells for circuit division. Then, based on the results of clustering and buffer cell insertion, the net structure of the gated clock circuit is also modified.

Figure 7:
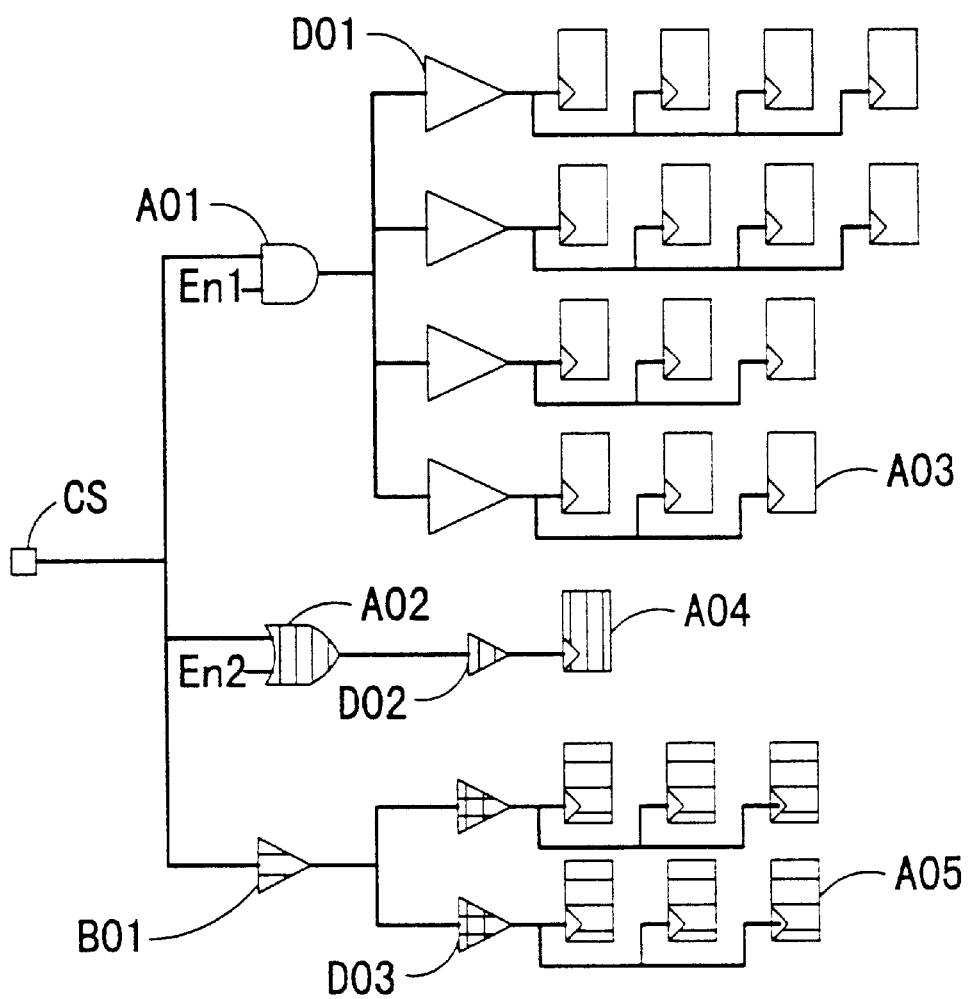
FIG. 7 is a circuit diagram showing the gated clock circuit after gated circuit division.

The gated clock circuit after carrying out division of the gated circuit is shown in FIG. 7 and its layout result is shown in FIG. 8.

In the gated cell division process 104, the gated cells A01, A02, B01 are allocated in the same number as the number of clusters divided in the above described gated circuit division process 103 for each of the gated cells A01, A02, B01, that is to say, the gated cells A01, A02, B01 are, respectively, divided so as to be the same number as the number of clusters divided in the gated circuit process 103. Then the optimum drive ability selected based on the input capacitance of the cells D01, D02, D03 inserted into the position where the load capacitance of the cluster becomes uniform in the above described gated circuit division process 103 and the drive limit capacitance of the gated cells is allocated to the divided gated cells, that is to say, to the gated cells for circuit division.

The gated cells for circuit division allocated in this way are inserted in the vicinity of the cells D01, D02, D03 which are inserted into the positions where the load capacitance of the cluster becomes uniform in the above described gated circuit division process 103. Then, based on the division result of the gated cells, the net structure of the gated clock circuit is modified. The gated cells F01, F02, F03 for circuit division which are inserted after the division of the gated cells are, respectively, connected to the same enabling signal as the gated cells A01, A02, B01 which were connected before the division of the gated cells.

Figure 9:
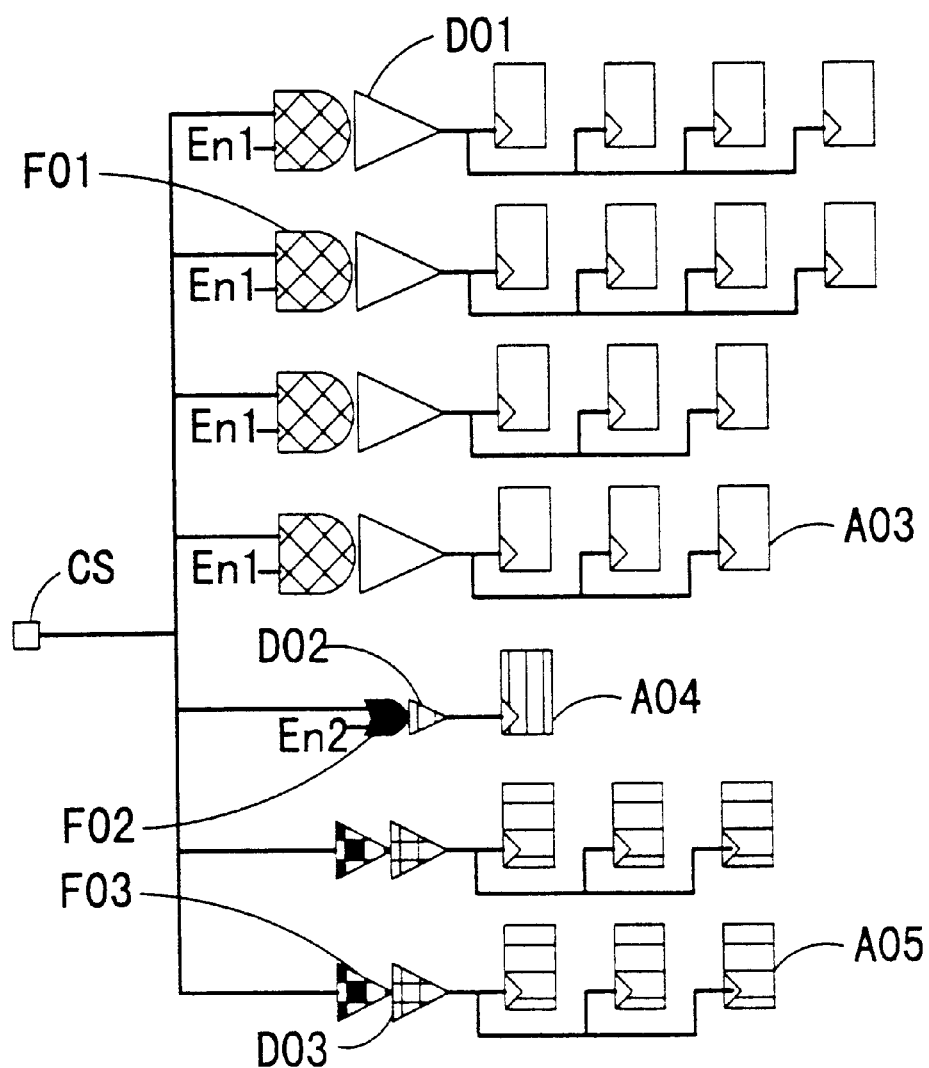
FIG. 9 is a circuit diagram showing the gated clock circuit after gated cell division.
Figure 10:
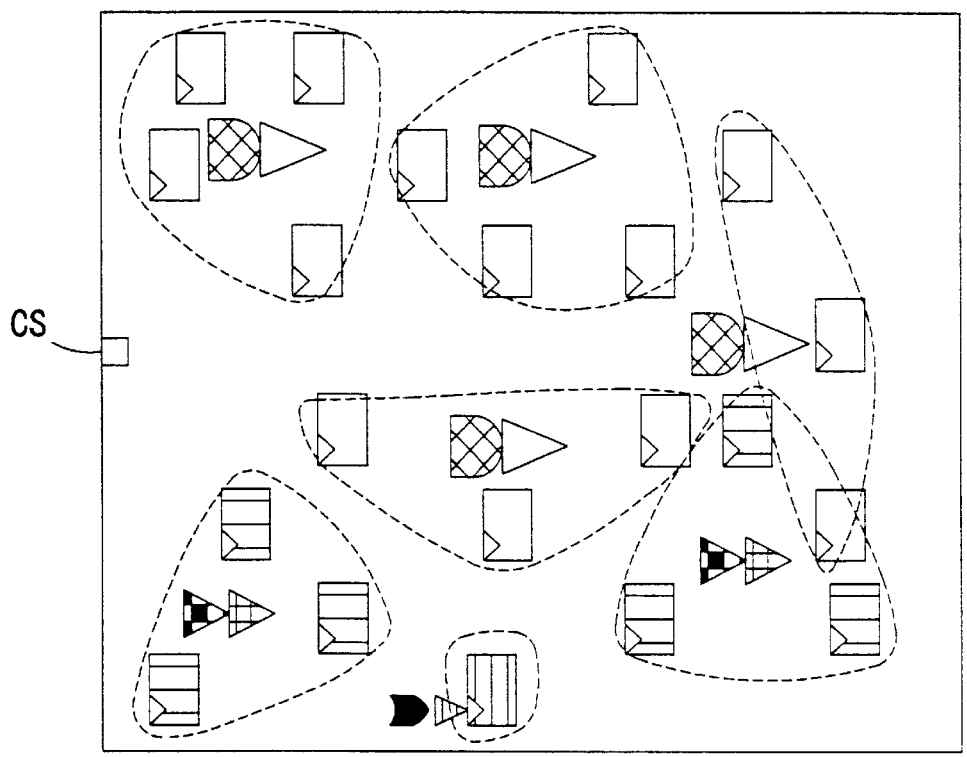
FIG. 10 is a schematic diagram showing the division result of the gated cell.

The gated clock circuit after the division of the gated cells is shown in FIG. 9, of which the layout result is shown in FIG. 10.

Figure 11:
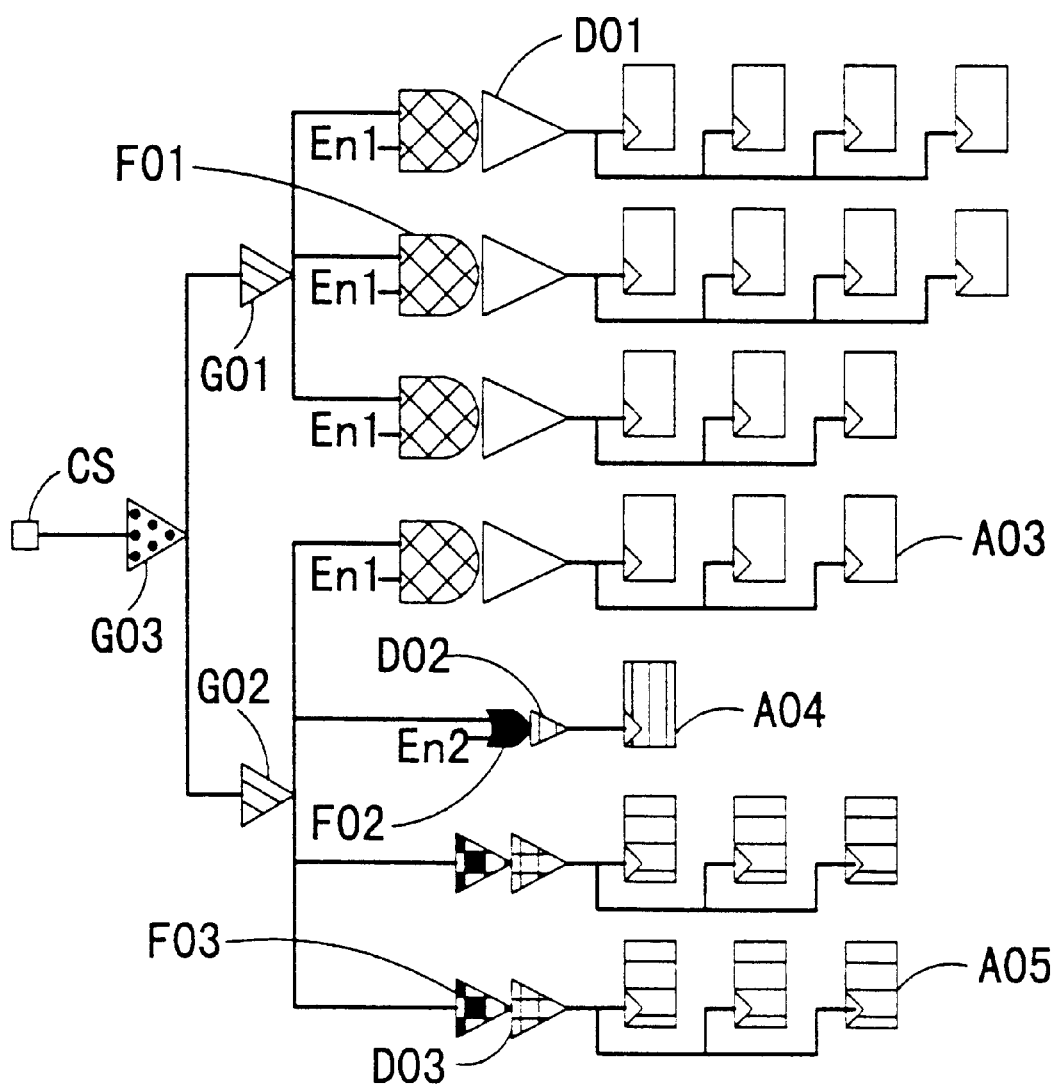
FIG. 11 is a circuit diagram showing the gated clock circuit after the gated cell front stage CTS.
Figure 12:
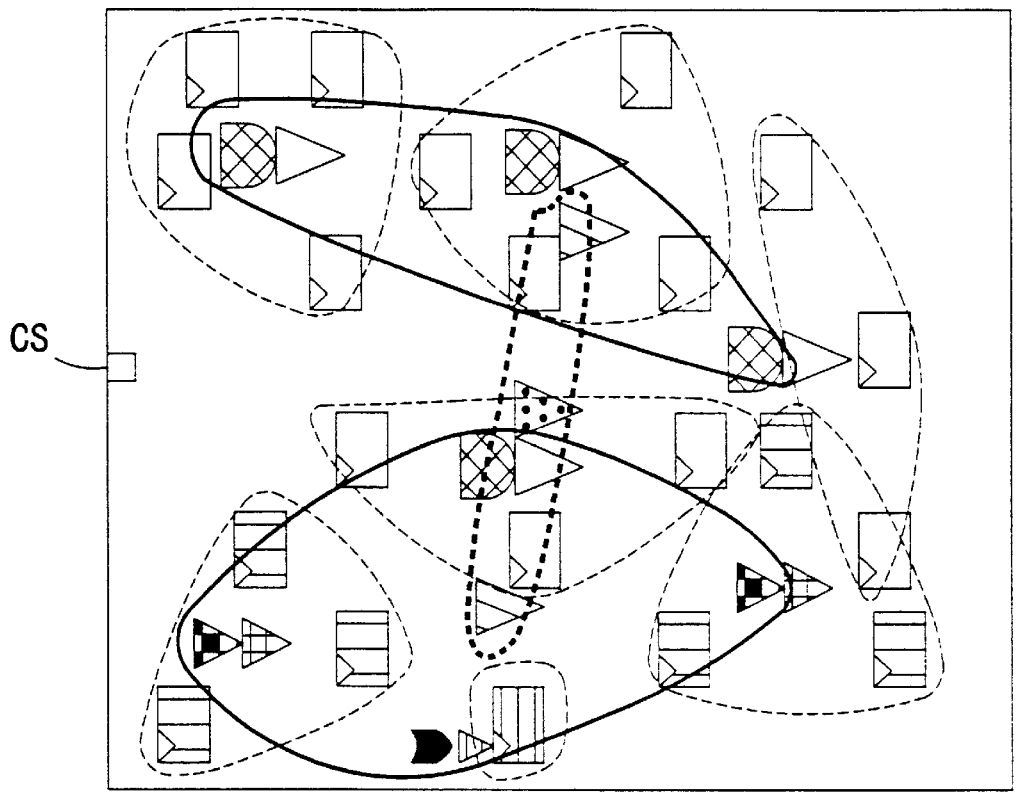
FIG. 12 is a schematic diagram showing the gated cell front stage CTS result.

In the gated cell front stage CTS process 105, a hierarchical tree is generated in the same way as the layout method of a semiconductor integrated circuit device of the "clock tree system" according to the above described prior art between the clock source CS and each of the gated cells F01, F02, F03 for circuit division. In the first embodiment, the clock tree of the gated cell front stage has the structure of a two stage tree at the buffer cells G01, G02, G03 for forming a clock tree. Based on the clock tree generated at the gated cell front stage, the net structure of the gated clock circuit is modified. The net structure after carrying out the CTS at the gated cell front stage is shown in FIG. 11, of which the layout result is shown in FIG. 12.

In the routing process 109, routing is carrying out following the net list so that the skew is made small in the same way as in the layout method of a semiconductor integrated circuit device of the "clock tree system" according to the above described prior art.

According to the layout method of a semiconductor integrated circuit device of this embodiment, the skew of the gated clock circuit can be reduced and the division number of the gated circuit can be made small even when the number of the elements connected to the gated cell, for example flip-flops, is inconsistent by positively using the cells with the same logic and different drive ability compared to the layout method of a semiconductor integrated circuit device for a conventional gated clock circuit. That is to say, the stage number and the buffer number of the clock tree between the clock source and the gated cells can be made small and, therefore, the delay value or the skew from the clock source to the elements can be reduced. Since it is not particularly necessary to designate the placement region for the element connected to each of the gated cells, problems, such as area increase or timing limit violations of the logic circuit, rarely occur.

In the first embodiment, at the time when the drive limit capacitance of the gated cells or the cells for delay adjustment is found the lower limit and the upper limit of the capacitance satisfying an arbitrary skew, that is the drive ability capacitance range of the cell, may be found.

Here in the process 102 for generating gated circuit division information, division should be carried out so that the total load capacitance of the clusters generated after the gated circuit division falls in the drive ability capacitance range of the cell. And in the gated cell division process 104 it is also necessary to prepare a cell of which the input capacitance of the buffer cell inserted at the time of gated circuit division falls in the drive ability capacitance range of the cell.

Though, in the net list modification process 101, a buffer cell is inserted into a flip-flop group directly connected to the clock source CS, a cell may be inserted which implements the same logic as the buffer cell by connecting an input terminal, other than the terminals to which clock signals of multi-input cells are inputted, to the power source or the ground.

Though, in the process 102 for generating gated circuit division information a virtual wire length between the flip-flops after the routing process 108 is used, rough routing may be carried out after the routing process 108. Since the wire capacitance between the flip-flops using the virtual wire length approximately the same as the actual wire length can be estimated by carrying out the rough routing, a more precise division number of the gated circuit or the allocation of the inserted cells can be carried out so as to further make the skew smaller.

In the process 102 for generating gated circuit division information, the upper limit may be given to the wire capacitance of each cluster as a division condition on determining the division number of clustering. By giving the upper limit to the wire capacitance the spread of the cluster can be controlled and, therefore, the skew caused by the wire shape or the influence from the wires nearby can be made small (corresponding to claim 4).

In the gated circuit division process 103, the total load capacitance of each cluster gained after the actual clustering may be found again to modify the drive ability of the inserted cells. By finding the total load capacitance of the clusters which actually carry out routing, the cells with more suitable drive ability I can be allocated and, therefore, the skew can be further made smaller.

In the case that the gated cell of the gated circuit is formed of positive logic such as "AND," "OR" or a buffer, a process may be added which replaces the logic of the gated cell and the logic of the cell inserted during the net list modification process 101 with reversed logic such as "NAND," "NOR" or an inverter during the net list modification process 101 and the process 102 for generating gated cell division information, respectively.

The cell formed of the positive logic such as "AND," "OR" or a buffer has a circuit structure to which an inverter cell is connected to the output side of, respectively, "NAND," "NOR" or an inverter of which the logic is inverted in the present invention since it is necessary to insert without fail a cell corresponding to a buffer at the next stage of the gated cell at the time of gated circuit division, a circuit making up as much as two stages of the inverter cell can be reduced by using a cell of which the logic is inverted and, therefore, the delay value and the power consumption can be reduced from the clock source to the flip-flop (corresponding to claim 3).

In this case, at the time of the process 102 for generating gated circuit division information, a cell corresponding to an inverter cell should be allocated as a cell inserted in a cluster after the gated circuit division.

In the routing process 109, routing may be carried out in the same way as other signal wires.

Second Embodiment Corresponding to claim 2

Figure 2:
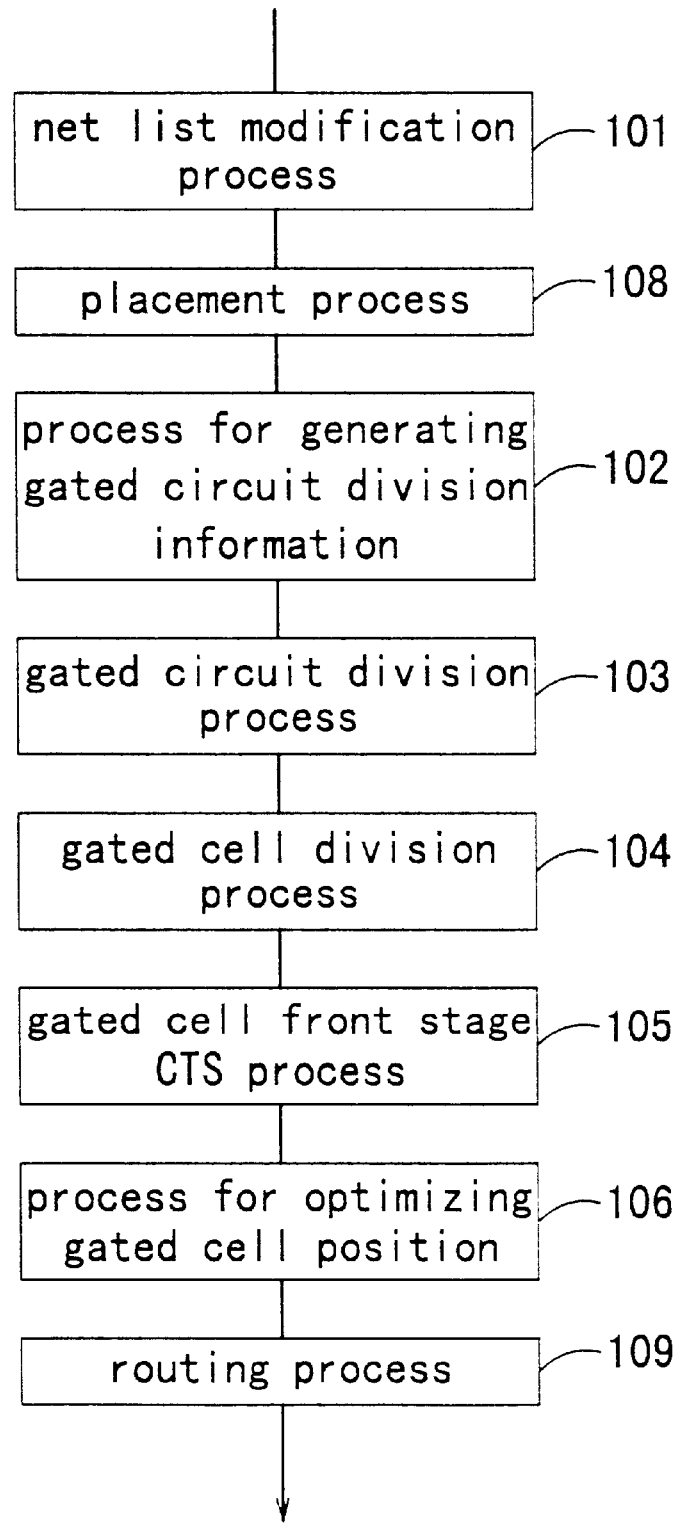
FIG. 2 is a flow chart showing the second embodiment according to the present invention.

The second embodiment of the present invention is described with reference to FIGS. 2, 13 and 14.

First, in the same way as in the first embodiment, the processes from the net list modification process 101 to the gated cell front stage CTS process 105 are implemented.

In the process 106 for optimizing gated cell position, the wire capacitance of each cluster of the clock tree is found from the result of the gated cell front stage CTS process 105 in the same way as the process 102 for generating gated circuit division information.

In the case that the inputs of the gated cells for circuit division belonging to the same cluster are all formed only of the same clock nets in the same way as the gated cells for circuit division are connected to the buffer cell G01 for forming a clock tree in FIG. 11, the gated cell F01 connected to the buffer cell G01 is reduced after the cell J01 with the same logic as the gated cell connected to the buffer cell G01 at the front stage of the buffer cell G01 for forming a clock tree, and then the buffer cell G01 and the buffer cell D01 for circuit division on the side of the flip-flop of the gated cell connected to the buffer cell G01 are connected. Next, by moving the gated cell for circuit division to the side of the clock source CS, the total load capacitance of the cluster varies and, therefore, the optimization of the drive ability of the cell from the total load capacitance of the cluster is carried out after the drive limit capacitance of the cell and the gated cells are moved to the side of the clock source CS. The reference symbols J02, J03 denote buffer cells substituting for the buffer cells G01, G03.

The above processes are repeated in a bottom up manner so as to move the gated cell to the side of the clock source CS.

Then, based on the result of the optimization of the gated cell position, the net structure of the gated clock circuit is modified. The connection of the enabling signal of the gated cell, which is added or reduced due to the optimization of the gated cell position, is reduced for the reduced cell or is connected to the same enabling signal as the original for the added cell.

In the routing process 109, routing is carried out in the same way as the first embodiment. According to this embodiment, the power consumption of the gated clock circuit can be reduced since the cells or wires, which can stop the operation at the time when a stop signal is inputted to the gated cell by moving the gated cell for circuit division to the side of the clock source, increase in number.

In the case that the sum of the wire load capacitance of the cluster and the input capacitance of the cell connected to the output terminal side of the gated cell before moving exceeds the drive capacitance limit of the cell driving the cluster when the gated cell for circuit division is moved to the side of the clock source the gated cell may not be moved to the side of the clock source since it becomes the cause of skew increase.

In the case that the time for the clock signal to reach to the gated cell which is moved from the clock source is shorter than the time for the enabling signal inputted into the moved gated cell to arrive as a result of the gated cell being moved to the side of the clock source, the gated cell may not be moved to the side of the clock source since it may cause incorrect operation. The number of the stages which can be moved to the side of the clock source may be estimated in advance to be added as a limit.

Though, in the placement process 108, no limitation is given to the placement of the gated clock circuit, a placement limitation may be given for each gated circuit in the same way as in the prior art (the Japanese unexamined patent publication H10 (1998)-308450). Though the possibility of causing area increase or a timing violation of the logic circuit becomes higher, the possibility of being able to reduce the power consumption becomes higher since the possibility of the gated cell being moved to the side of the clock source becomes greater in the process 106 for optimizing the gated cell position.

Third Embodiment Corresponding to claims 5 and 14

The third embodiment of the present invention is described with reference to the drawings.

Figure 16:
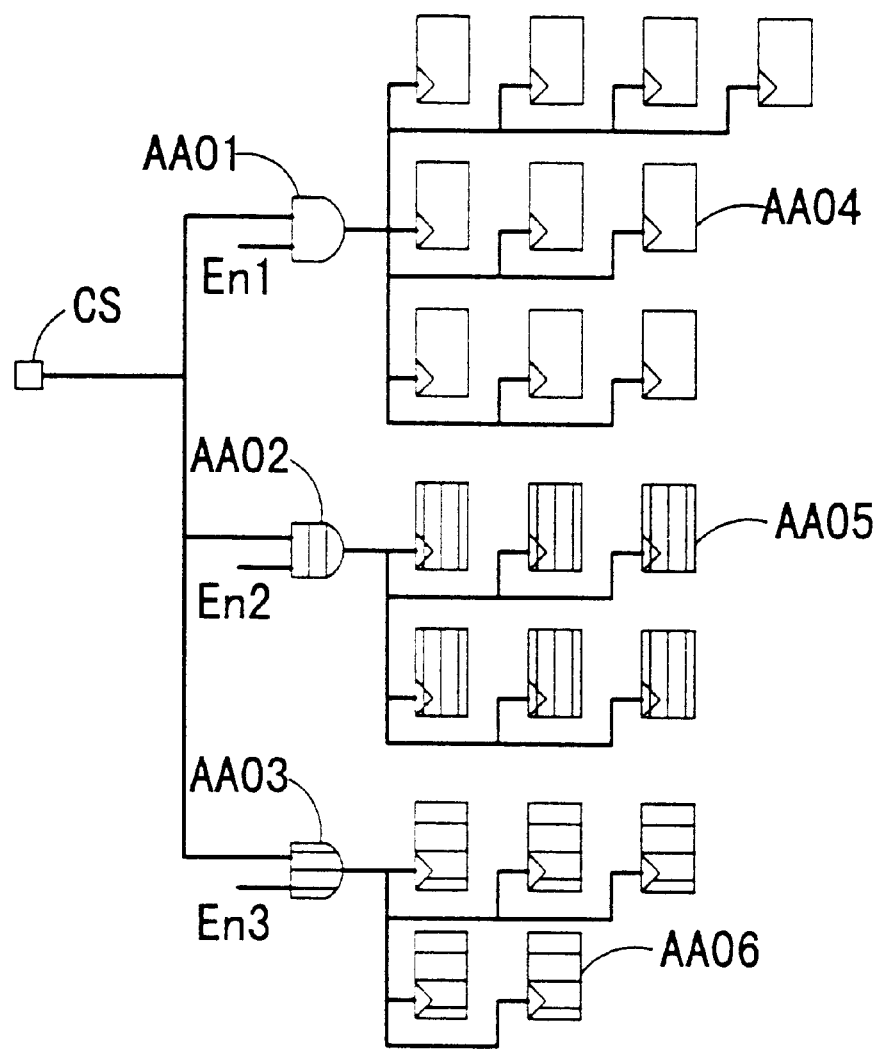
FIG. 16 is a circuit diagram showing the gated clock circuit.
Figure 17:
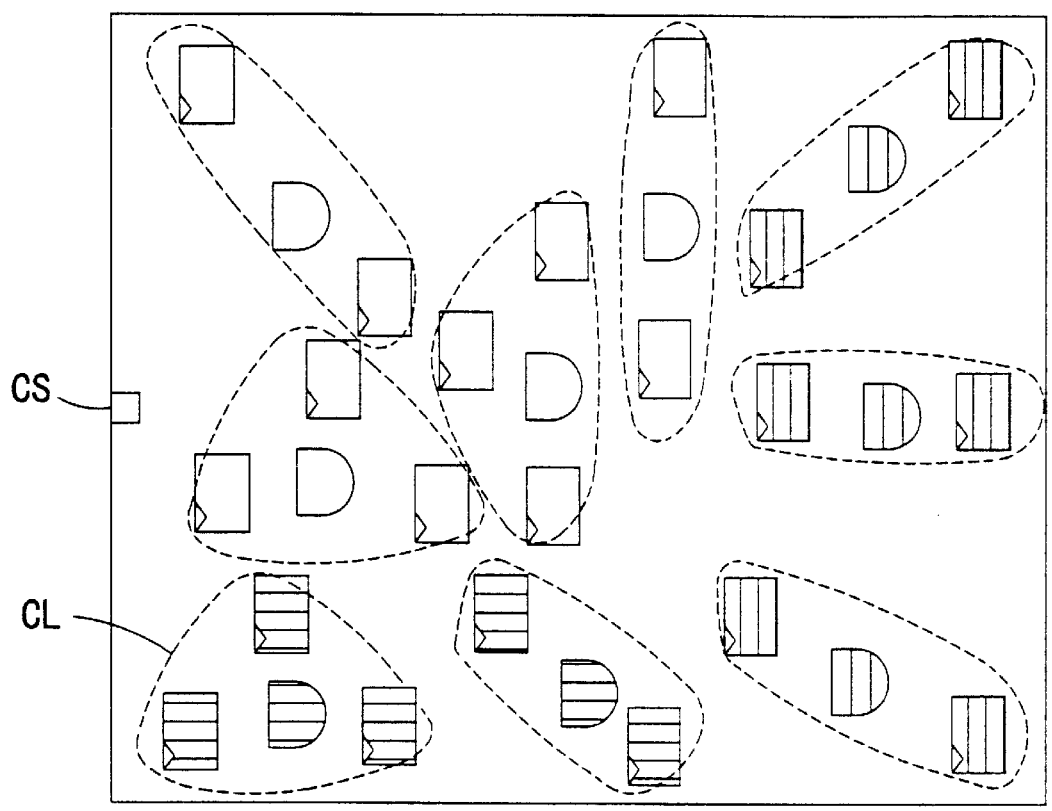
FIG. 17 is a schematic diagram showing the placement result after the gated circuit division.
Figure 18:
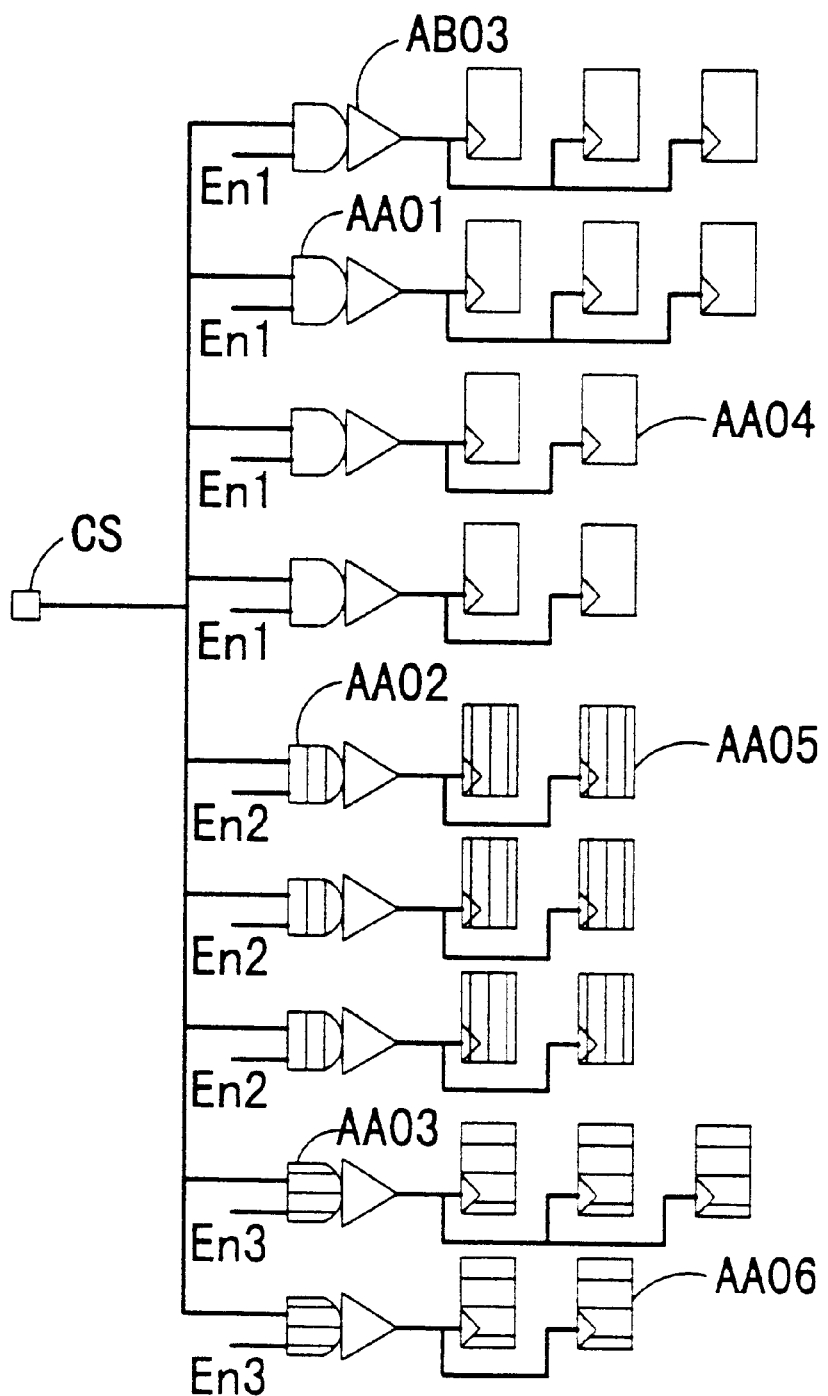
FIG. 18 is a circuit diagram showing a circuit after the gated circuit division.

Each of the processes from the net list modification process 101 to the gated circuit division process 104 is first carried out according to the same way as the second embodiment for the gated clock circuit in FIG. 16. The placement result after the gated circuit division process 104 is shown in FIG. 17 and a circuit diagram is shown in FIG. 18. In the FIGS. 16, 17 and 18, the reference symbols AA01, AA01, AA03 denote the gated cell, the reference symbols AA04, AA05, AA06 denote the flip-flop and the reference symbol AB03 denotes a buffer cell which is a cell for circuit division.

Here, to make it easy to see the result of the clustering, the buffer cell AB03 view is omitted in FIG. 17 which shows the placement result.

Figure 19:
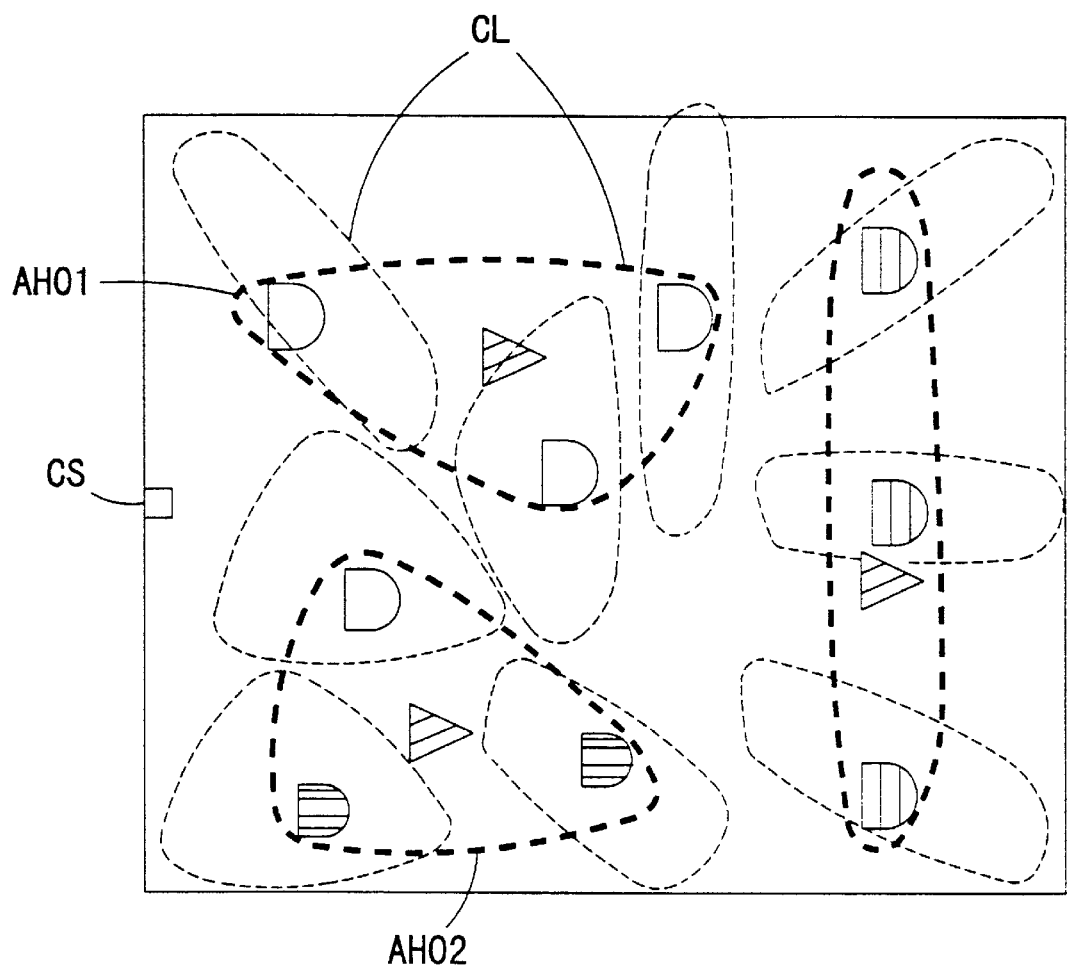
FIG. 19 is a schematic diagram showing the placement result after clustering according to the third embodiment of the present invention.

Next, in the gated cell front stage CTS process 105, on carrying out clustering between the clock source CS and each of the gated cells AA01, AA02 and AA03, instead of an evaluation function (hereinafter referred to as a previous evaluation function) which places a priority on the cluster where the sum of the load capacitance difference between each cluster and the load capacitance within the cluster becomes the minimum in the same way as conventional clustering, an evaluation function (hereinafter referred to as the first novel evaluation) where the sum of the load capacitance difference between each cluster and the load capacitance within the cluster satisfies the preset capacitance value, respectively, and kinds of cells with different attributions comprising at least each cluster, for example the gated cells with different inputs are minimum in number and a priority is placed on the cluster of which the number of each of the gated cells with different inputs forming the cluster is used to carry out clustering. The placement result of the above described clustering is shown in FIG. 19.

Hereinafter, the view of the flip-flops A04, A05, A06 in FIG. 19, which shows the placement result in order to make it easier to see the clustering result, is omitted.

The process 106 for optimizing gated cell position and routing process 109 are carried out in the same way as the second embodiment after generating a clock tree by repeating the clustering process by this first novel evaluation function.

Figure 20:
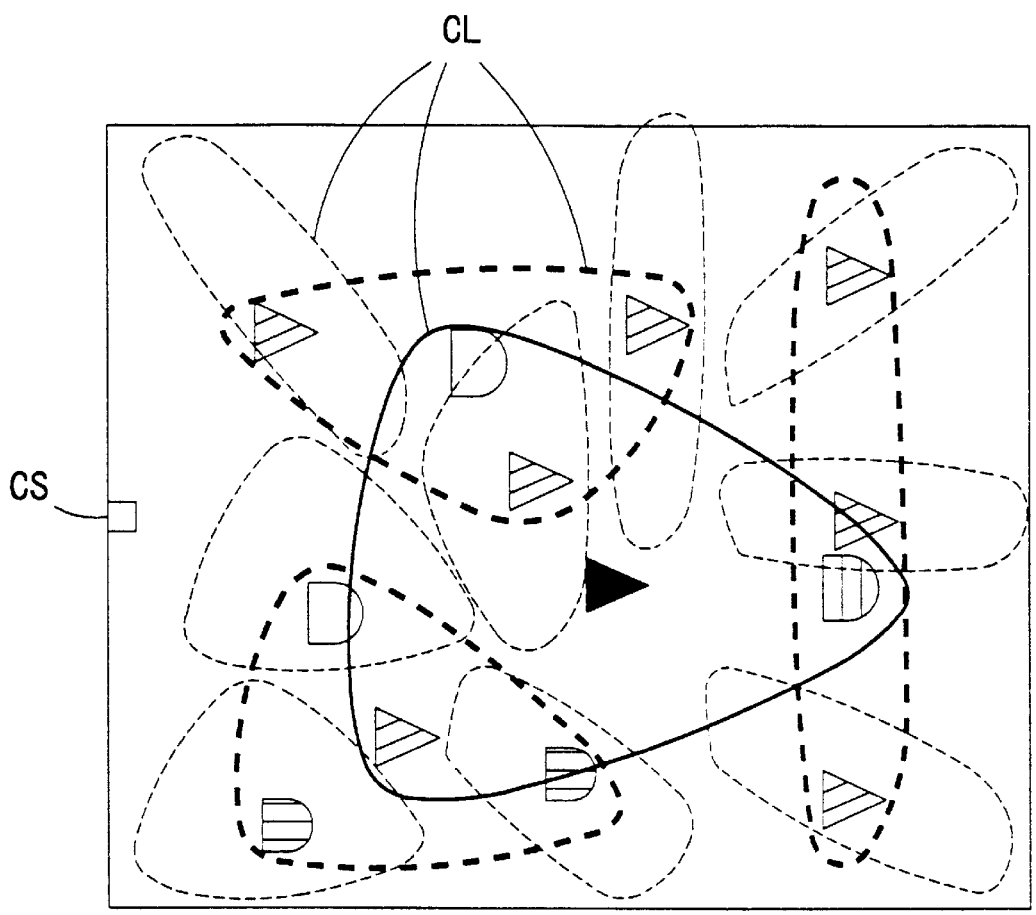
FIG. 20 is a schematic diagram showing the placement result after the skew adjustment of the clock signal of the gated circuit according to the third embodiment of the present invention.
Figure 21:
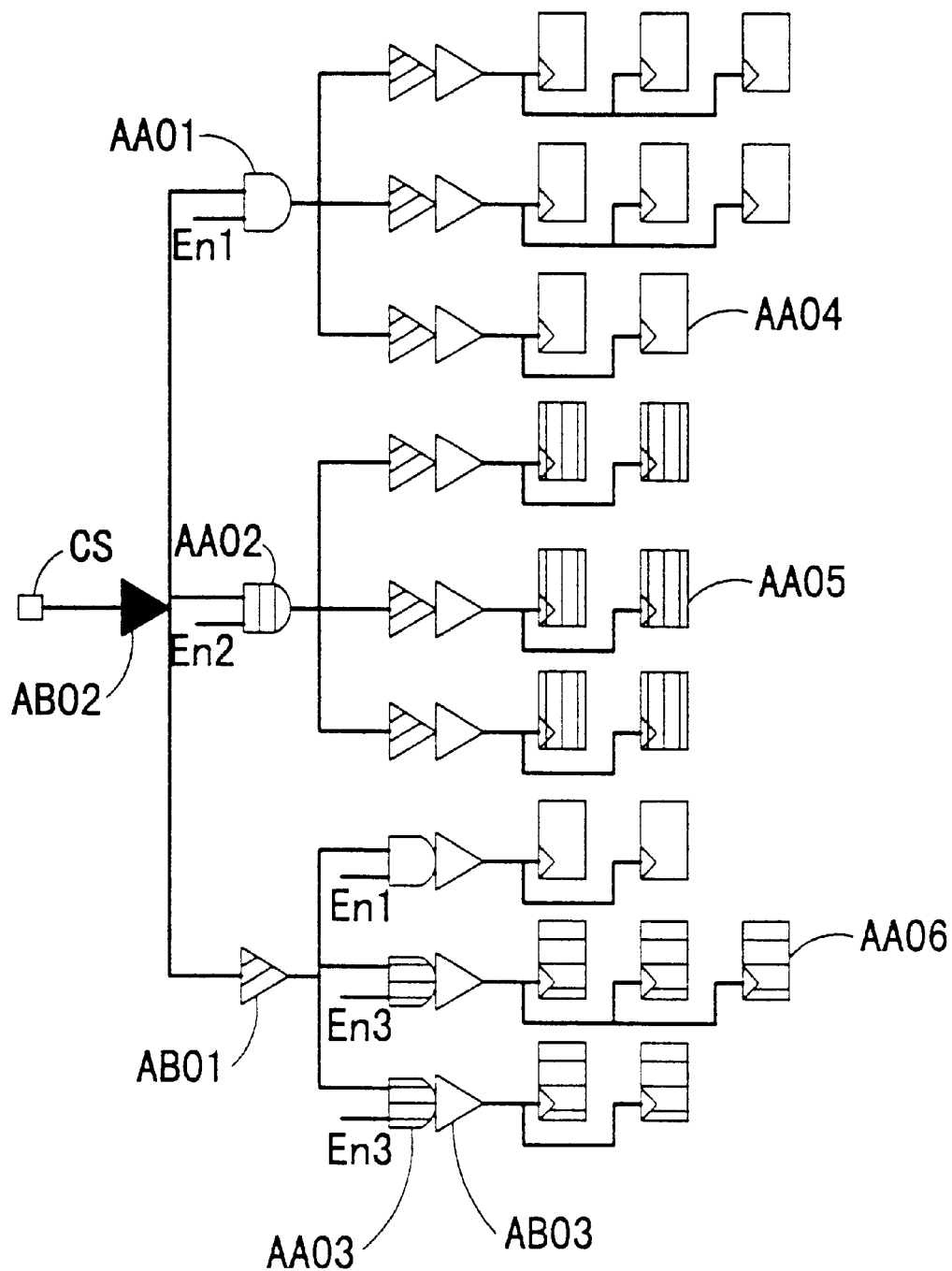
FIG. 21 is a circuit diagram showing a circuit after the skew adjustment of the clock signal of the gated circuit according to the third embodiment of the present invention.

The placement result to which a clustering method using the first novel evaluation function for the second embodiment is applied is shown in FIG. 20, of which the circuit diagram is shown in FIG. 21. In FIGS. 20 and 21, the reference symbols AB01, AB02 show buffer cells for forming a clock tree and AB03 denotes a buffer cell for circuit division.

Figure 22:
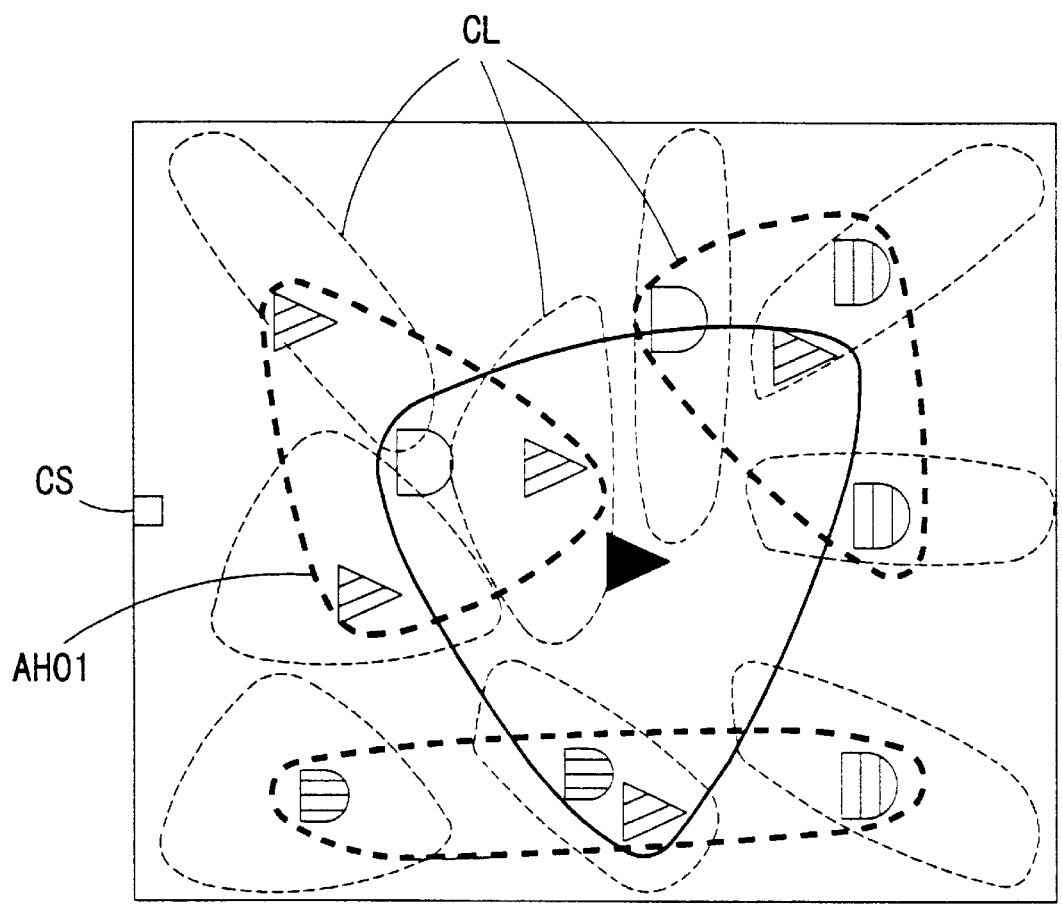
FIG. 22 is a schematic diagram showing the placement result after the gated cell is moved to the clock source side.
Figure 23:
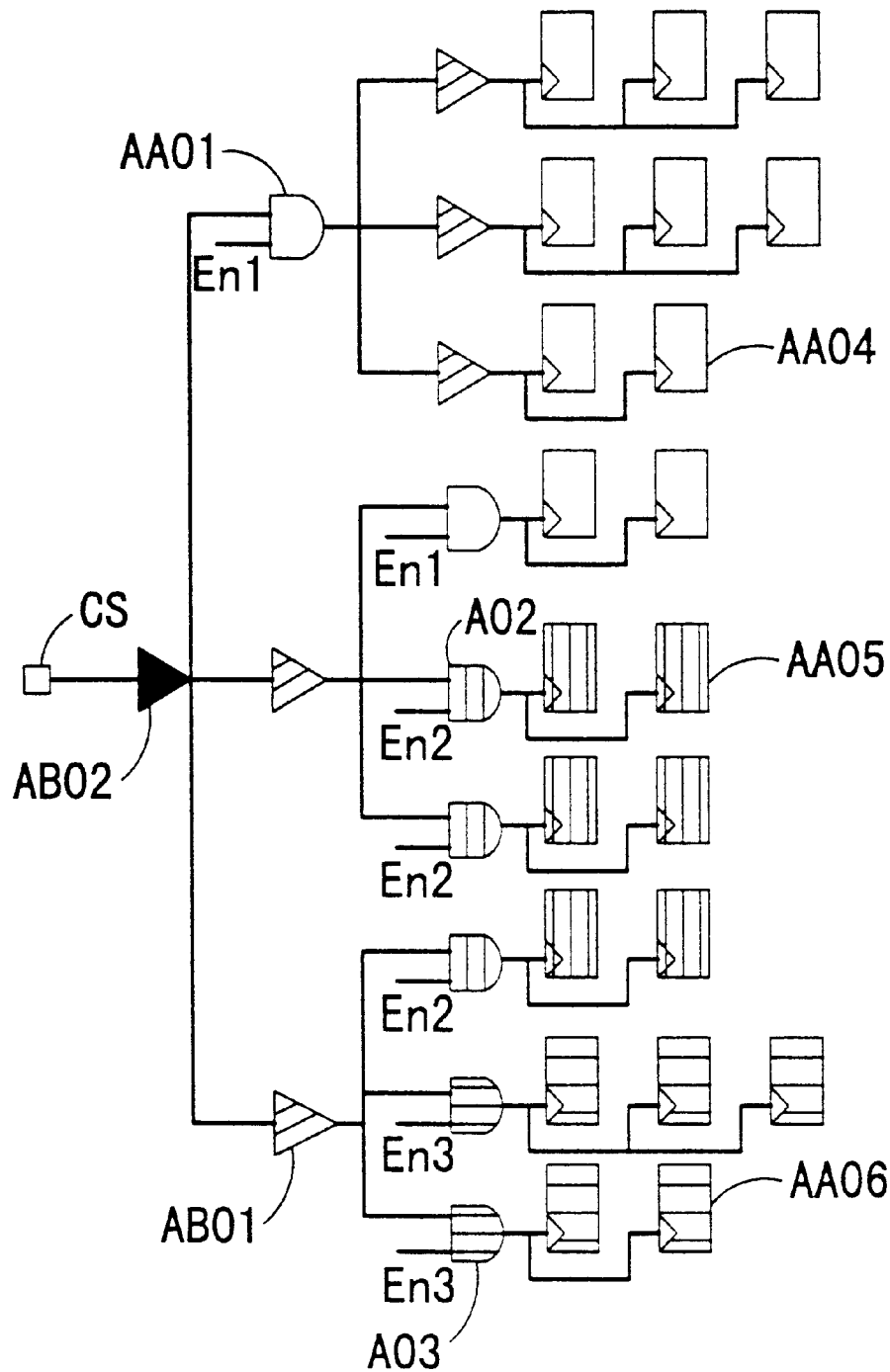
FIG. 23 is a circuit diagram showing a circuit after the gated cell is moved to the clock source side.

In the case that clustering by the previous evaluation function evaluation function is applied to the clustering of the gated cell front stage CTS process 105 for FIG. 19 showing the gated circuit, the clustering by the previous evaluation function places a priority on the cluster where the sum of the load capacitance difference between clusters and the load capacitance within the cluster becomes minimum. The placement result where the clustering by the previous evaluation function is applied is shown in FIG. 22, of which the circuit diagram is shown in FIG. 23. As shown in FIGS. 20 and 21, by applying the first novel evaluation function to the clustering, the cluster formed only of the gated cells for circuit division which have the same input can be generated effectively compared to the result where clustering by the previous evaluation function is applied as shown in FIGS. 22 and 23 and, therefore, it becomes possible to move gated cells for circuit division to the side of the circuit source in greater number than in the clustering by the previous evaluation function in the process 106 for optimizing gated cell position.

According to this embodiment, a cluster formed only of the cells with the same attribution can be effectively generated. For example, in the case of application to the gated clock circuit, since the cluster formed only of the gated cells for circuit division with the same input can be generated efficiently, an increasing number of cells and wires can stop the operation at the time when a stop signal is inputted to the gated cells. Therefore, the power consumption at the gated clock circuit can be reduced. Moreover, since it is not particularly necessary to designate the placement region for each flip-flop connected to each gated cell, problems, such as area increase and timing limit violations of the logic circuit, rarely occur.

In the case of application to a circuit design method referred to as a useful skew which makes it possible to have a circuit design at high speed by purposely allowing the flip-flop to have a plurality of delay times, the cluster formed only of the flip-flops to which the same delay time is allocated can be effectively generated so as to make it possible to facilitate the adjustment of the clock skew.

Though there are some cases where clusters formed only of the gated cells with the same input cannot be generated to satisfy the skew and the delay value between each cluster depending on the placement condition of the gated cell, the same cluster as a conventional clustering can be gained by way of an evaluation term which places a priority on a cluster satisfying the skew and the delay value between each cluster. The first novel evaluation function may also be applied to the clustering process of the gated circuit division process 102. Since the inputs of the cells belonging to the cluster are all the same in the gated circuit division process 102, the same result as a conventional clustering can be gained irrespective of the evaluation term "kinds of gated cells with different inputs forming each of the clusters are minimum in number and a priority is placed on the cluster of which the number of each of the gated cells, with different inputs forming the cluster, is large." In the case that the first novel evaluation function is applied to the clustering for the clustering of the gated circuit division process 102 or a conventional CTS, the process time can be shortened by multiplying 0 by the evaluation term "kinds of gated cells with different inputs forming each of the clusters are minimum in number and a priority is placed on the cluster of which the number of each of the gated cells, with different inputs forming the cluster, is large" or by adding a process condition of nullification.

When applying the first novel evaluation function to the clustering of the gated cell front stage CTS process 105, after carrying out the clustering to each stage of the tree in the gated cell front stage CTS process 105 the clock trees are generated in sequence by repeating the process 106 for optimizing gated cell position, it then becomes possible to make the additional capacitance uniform in the clustering process in comparison to the method for moving the gated cell to the side of the clock source after forming a CTS at the gated cell front stage so as to further reduce the clock skew.

Fourth Embodiment Corresponding to claims 6 and 15

The fourth embodiment of the present invention is described with respect to the drawings.

A circuit diagram after each process is carried out up to the one before the gated cell front stage CTS process 105 according to the same method as the second embodiment for the gated clock circuit in FIG. 16 is shown in FIG. 17, of which the placement result is shown in FIG. 18.

Next, on carrying out clustering between the clock source CS and each of the gated cells AA01, AA02, AA03, instead of the previous evaluation function which places a priority on the cluster where the sum of the load capacitance difference between each cluster and the load capacitance within the cluster becomes the minimum in the same way as conventional clustering, the second novel evaluation function is used which places a priority on the cluster where kinds of cells with different attributions forming each cluster, for example, the gated cells with different inputs, are minimum in number, the number of each of the gated cells with different inputs forming the cluster is large and the skew and the delay value between each cluster satisfy preset values by adjusting the drive ability of the buffer cell inserted in accordance with the load capacitance of each cluster, that is to say, the sum of the load capacitance difference between each cluster and the load capacitance of the cluster satisfies a preset capacitance value.

Figure 24:
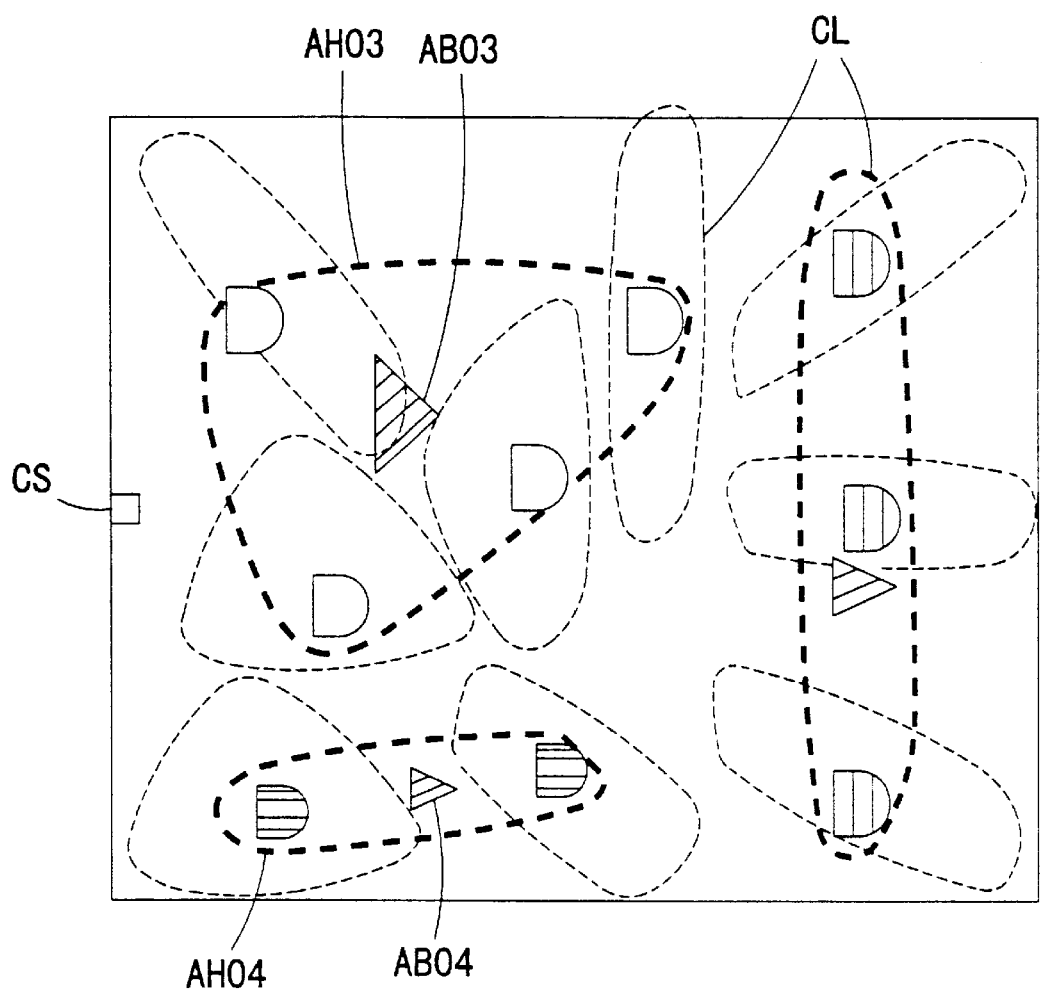
FIG. 24 is a schematic diagram showing the placement result after clustering according to the fourth embodiment of the present invention.

As shown in FIG. 24 in order to prioritize the cluster of which the kinds of the gated cells with different inputs forming, each cluster are minimum in number and of which the number of each dedicated cell with different in puts forming the cluster is large, the delay value between each cluster is made uniform by inserting a buffer cell AB03 with large drive ability to the cluster AH03 of which the load capacitance within the cluster becomes large due to the number and the placement spread of gated cells forming the cluster, and by, on the contrary, inserting a the buffer cell AB04 with small drive ability to the cluster AH04 of which the load capacitance within the cluster becomes small.

Then by replacing the logic between the gated cell of each cluster consisting only of the gated cells AA01, AA02 and AA03 with the same input and the buffer cell AB01 inserted into the cluster, the gated cells are moved to the side of the clock source CS. At this time, the drive ability of the gated cell and the buffer cell is adjusted so as to satisfy the skew and the delay time between clusters.

After repeating the above processes, a routing process is carried out in the same way as in the first embodiment or in the second embodiment.

In the case that the second novel evaluation function is used, the skew and the delay value between each cluster satisfy preset values by adjusting the drive ability of the buffer cell and the gated cells then the cluster as shown in FIG. 24 can be generated.

In the case that the above described second novel evaluation function is used, the capacitance difference can be given between the clusters in the delay adjustment range by the drive ability of the delay adjustment cell inserted in the cluster and, therefore, the cluster formed only of the gated cells with the same input can further be generated effectively in comparison with the case in which the first novel evaluation function is used.

Figure 25:
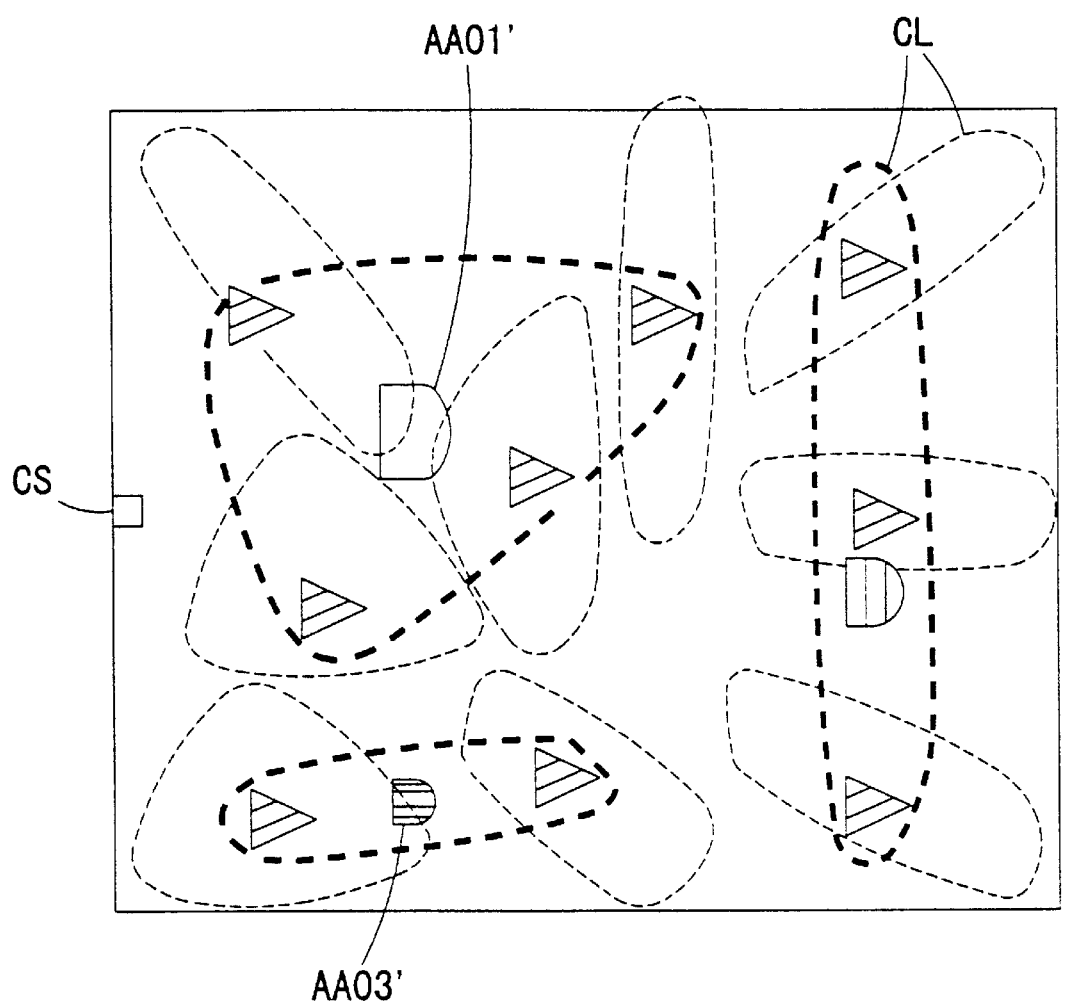
FIG. 25 is a schematic diagram showing the placement result after the skew adjustment of the clock signal of the gated circuit according to the fourth embodiment of the present invention.
Figure 26:
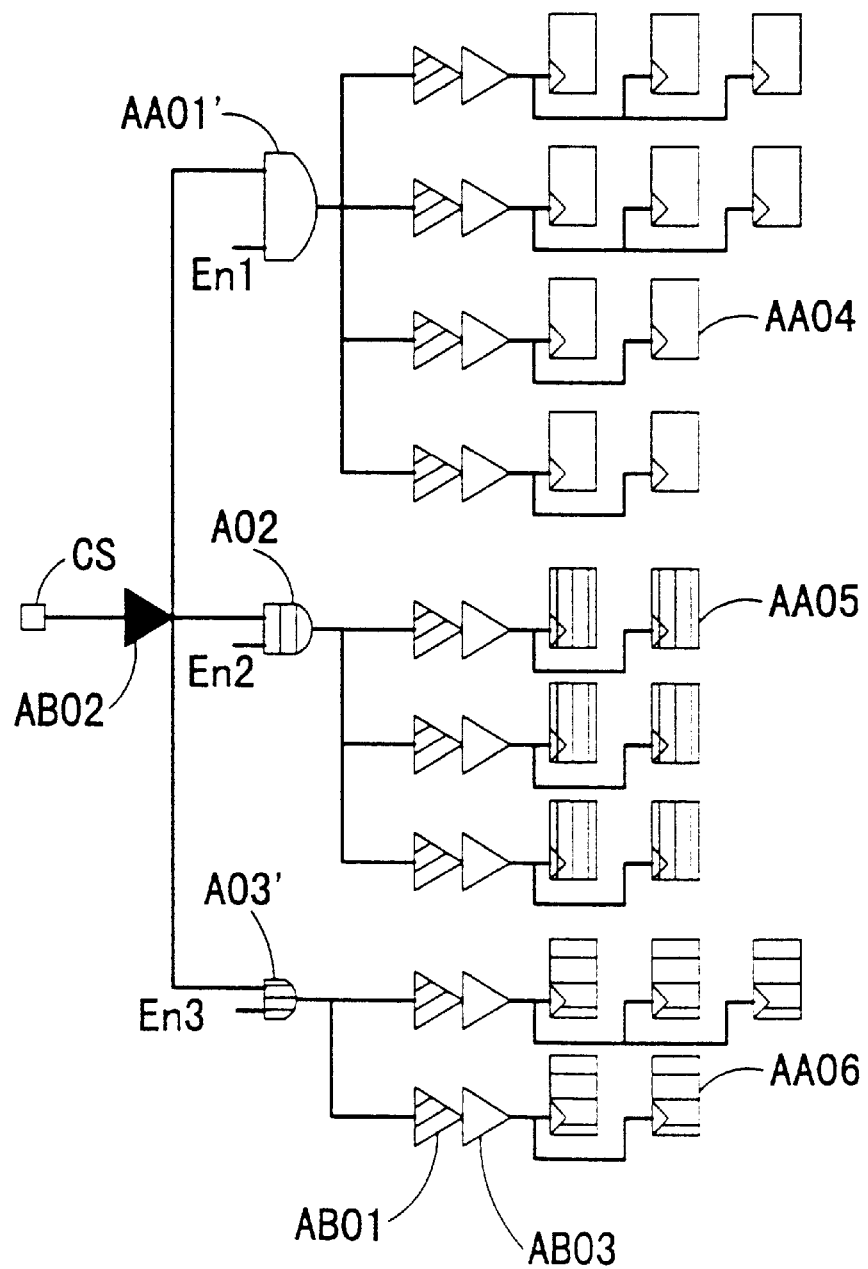
FIG. 26 is a circuit diagram showing a circuit after the skew adjustment of the clock signal of the gated circuit according to the fourth embodiment of the present invention.

The placement result after applying the layout method of a semiconductor integrated circuit device using the above described second novel evaluation function is shown in FIG. 25, of which the circuit diagram is shown in FIG. 26. This figure shows the result after the logic is replaced between the gated cell of the cluster and the buffer cell is inserted into the cluster. In FIG. 25 and FIG. 26, the reference symbol A01' and A03' denote a gated cell.

According to this embodiment, at the time of clustering, in the case that an evaluation function is used where the sum of the load capacitance difference between each cluster and the load capacitance of the cluster satisfies the preset capacitance value the kinds of attributes of the different cells at least forming the cluster are the minimum in number and a priority is placed on the cluster of which the number of the cells for each attribute which forms the cluster, the possibility can be reduced that the skew increases or cells with different attributes mix due to the number of cells or the placement spread of the cells belonging to the cluster in comparison with the case where the drive ability of the cell inserted into the cluster is not adjusted since the drive ability of the cell inserted into the cluster is adjusted. Though, depending on the placement condition of the gated cells there are some cases where the cluster formed only of gated cells with the same input cannot be generated since in order to satisfy the skew and the delay value between each cluster, the same cluster as a conventional clustering can be gained by the evaluation term where a priority is placed on the cluster satisfying the skew and the delay value between each cluster. The first novel evaluation function may also be applied to the clustering process of the gated circuit division process 102. In the gated circuit division process 102, since the inputs of the cells belonging to the cluster are all the same, the same result as a conventional clustering can be gained irrespective of the evaluation term "kinds of gated cells with different inputs forming each cluster arc the minimum in number, and a priority is placed on the cluster of which the number of each gated cell, with different input forming the cluster, is large.

In the case that the first novel evaluation function is applied to clustering for the clustering of the gated circuit division process 102 or a conventional CTS, the process time can be shortened by multiplying 0 by the evaluation term "kinds of gated cells with different inputs forming each cluster are the minimum in number, and a priority is placed on the cluster of which the number of each gated cell, with different input forming the cluster, is large" or by adding a process condition of nullification.

When applying the first novel evaluation function to the clustering of the gated cell front stage CTS process 105, after carrying out the clustering to each stage of the tree in the gated cell front stage CTS process 105 the clock trees are generated by repeating the process 106 for optimizing gated cell position, then it becomes possible to make the additional capacitance uniform in the clustering process in comparison with the method for moving the gated cell to the side of the clock source CS after forming a CTS at the gated cell front stage so as to further reduce the clock skew.

Fifth Embodiment Corresponding to claims 7, 8, 16 and 17

The fifth embodiment of the present invention is described with reference to the drawings.

The cluster as shown in FIG. 19 is assumed to be generated by carrying out the processes up to clustering after the gated circuit division according to the same method as the first, the second, the third or the fourth embodiments for the gated clock circuit in FIG. 16.

The cluster AH02 formed of two kinds of gated cells for circuit division AA01 and AA03 cannot move the gated cells AA01 and AA03 to the side of the clock source CS.

Figure 27:
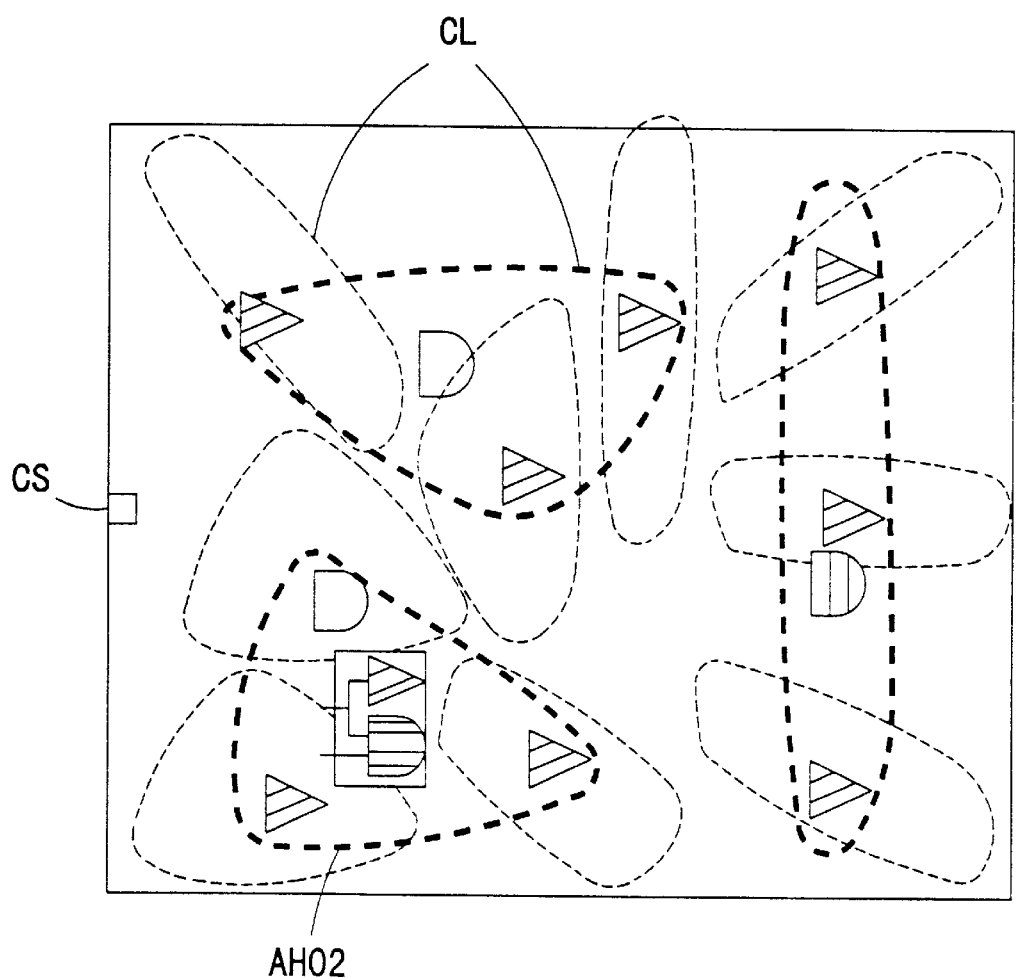
FIG. 27 is a schematic diagram showing the placement result after clustering according to the fifth embodiment of the present invention.

The gated cells AA01, AA03 forming the cluster AH02 and the buffer cell AB01 inserted into the cluster AH02 are considered to be replaced with the cell AD01 as shown in FIG. 27.

The cell AD01 has at least one clock signal input terminal and one or more enabling signal input terminals and output terminals and comprises one or more cells having the same logic circuit as the gated cells for circuit division and a cell having a circuit for allowing one clock signal to pass through, which is a set of cells of which the input terminals of the clock are connected in common.

Then, in the case that the above described gated cells AA01, AA03 and the buffer cell AB01 for forming a clock tree inserted into the cluster AH02 are replaced with the cell AD01, the increased power consumption by inserting the cell AD01 and the reduced power consumption by moving the cell AA03 to the side of the clock source CS are compared and the cells are replaced in the case that the power consumption can be reduced and is not replaced in the case that it cannot be reduced.

At this time, based on the input capacitance of the cell connected to each out put terminal after the replacement and on the virtual wire capacitance between the cells connected to each output terminal, the drive ability of the cell is adjusted so as to satisfy the skew.

Figure 28:
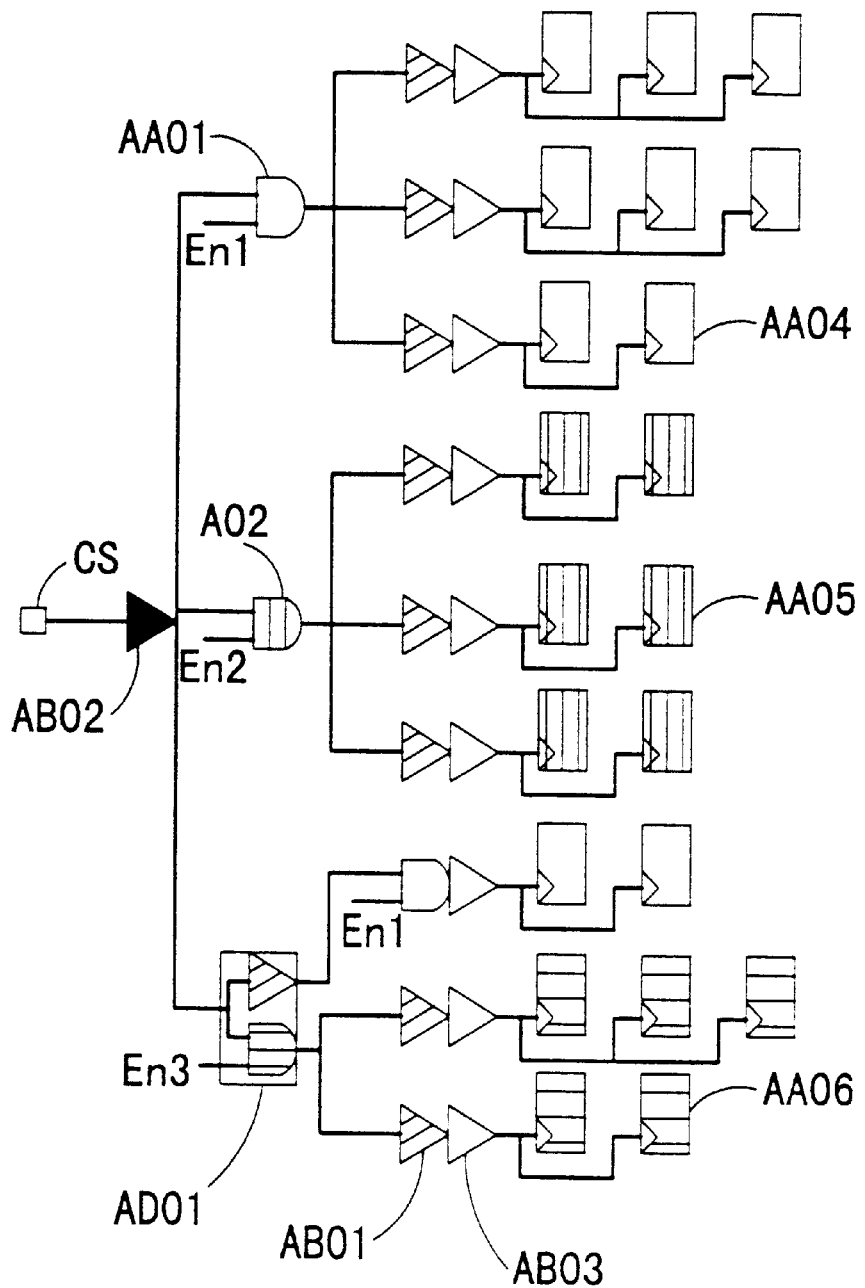
FIG. 28 is a circuit diagram showing a circuit after the skew adjustment of the clock signal of the gated circuit according to the fifth embodiment of the present invention.

The placement result of the replacement of the cells is shown in FIG. 27, of which the circuit-diagram in FIG. 28.

By applying the above described cell AD01, it becomes possible to move the cluster which cannot move the gated cells to the side of the clock source according to the method of the first embodiment or the second embodiment, that is to say, to move the gated cell AA03 of the cluster AH02 where cells with different attributes mix to the side of the clock source CS. As a result, the power consumption of the gated clock circuit can be further reduced.

Figure 29:
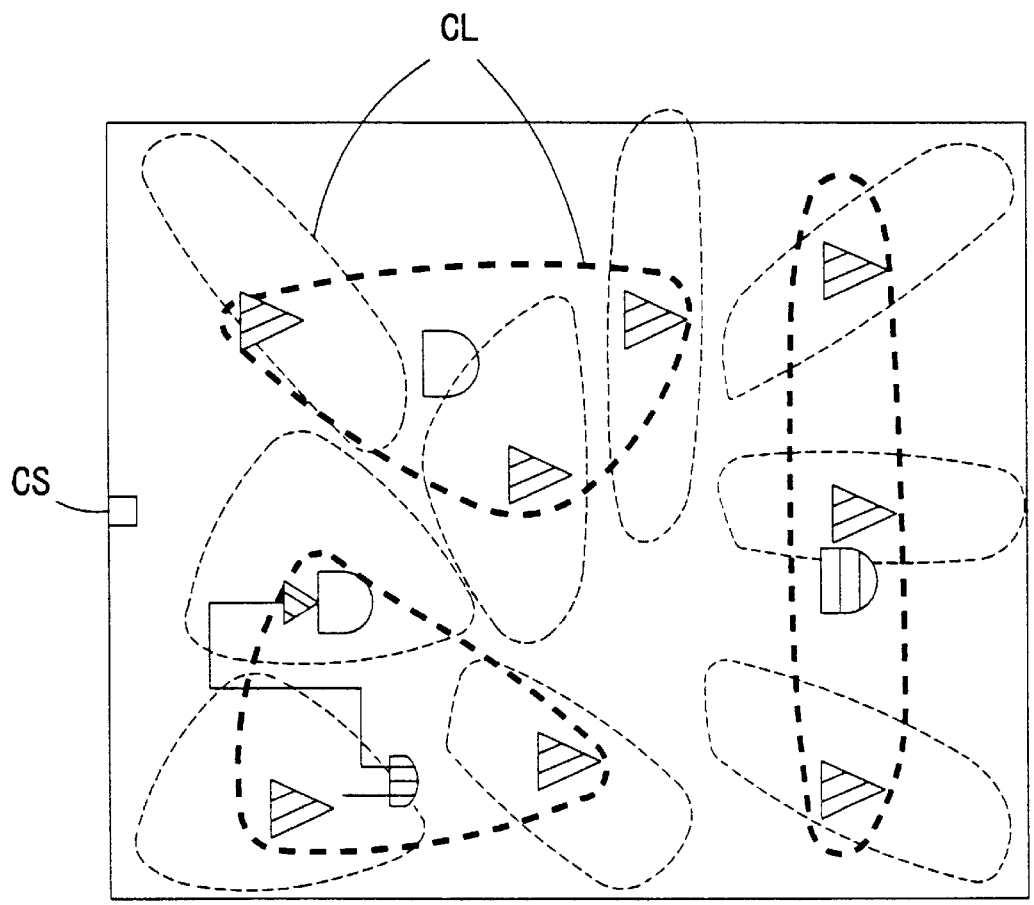
FIG. 29 is a schematic diagram showing the placement result after clustering according to the fifth embodiment of the present invention.

In accordance with the buffer cell (the cell for forming a tree) inserted into the cluster after clustering and the cell (the gated cell for circuit division) forming the cluster, the circuit AE01 in FIG. 29 which uses the cell AD01 for the replacement can also be utilized for the replacement.

The circuit AE01 is formed of at least one or more cells A030 which has the same logic circuit as the gated cell for circuit division and the cell A010 driving without modifying the logic, and is a circuit of which the input terminals of the clock are connected in common with each other.

In this case, in the same way as described above, the, increased power consumption by replacing the gated cells AA01, AA03 for circuit division and the buffer cell AB01 for forming a clock tree inserted into the cluster AH02 with the circuit AE01 and the reduced power consumption by moving the cell of the gated cell AA03 to the side of the clock source CS are compared and the circuit is modified in the case that the power consumption can be reduced. In the case that it cannot be reduced the circuit is not modified.

At this time based on the input capacitance of the cell connected to each output terminal of the cell inserted after the replacement so as to satisfy the skew and the virtual wire capacitance between the cells connected to each output terminally he drive ability of the gated cell and the buffer cell is adjusted and, moreover, is inserted into the position which makes the load capacitance uniform.

Figure 30:
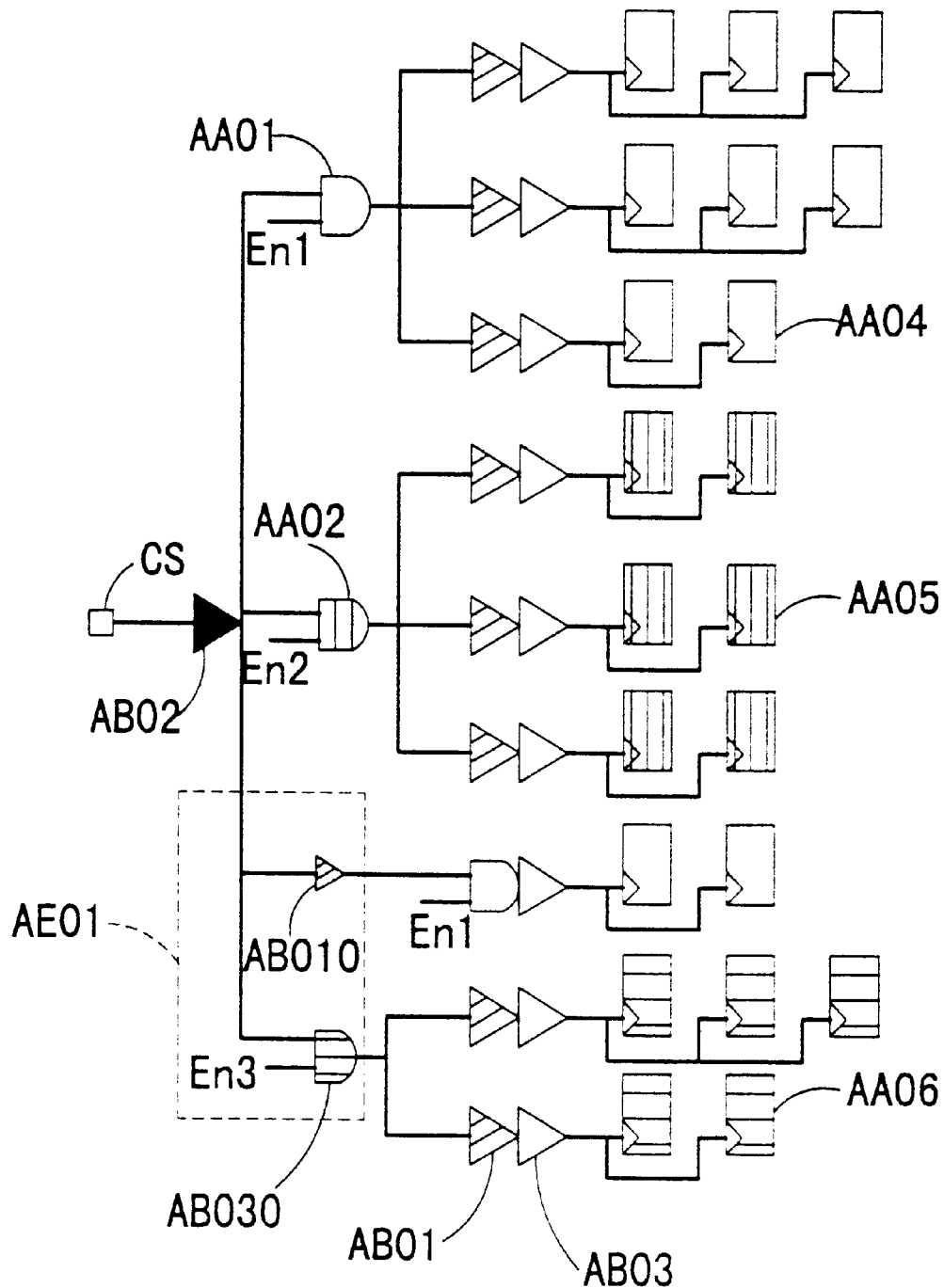
FIG. 30 is a circuit diagram showing a circuit after the skew adjustment of the clock signal of the gated circuit according to the fifth embodiment of the present invention.

The placement result after the circuit is modified is shown in FIG. 29, of which the circuit diagram is shown in FIG. 30.

In this case, the gated cells or the buffer cell can be inserted into a position which makes the skew for the cells of each attribute smaller than in the case that the cell AD01 is utilized and, therefore, the skew can further be made smaller than in the case that cell AD01 is utilized.

Sixth Embodiment Corresponding to claims 9 and 18

Figure 3:
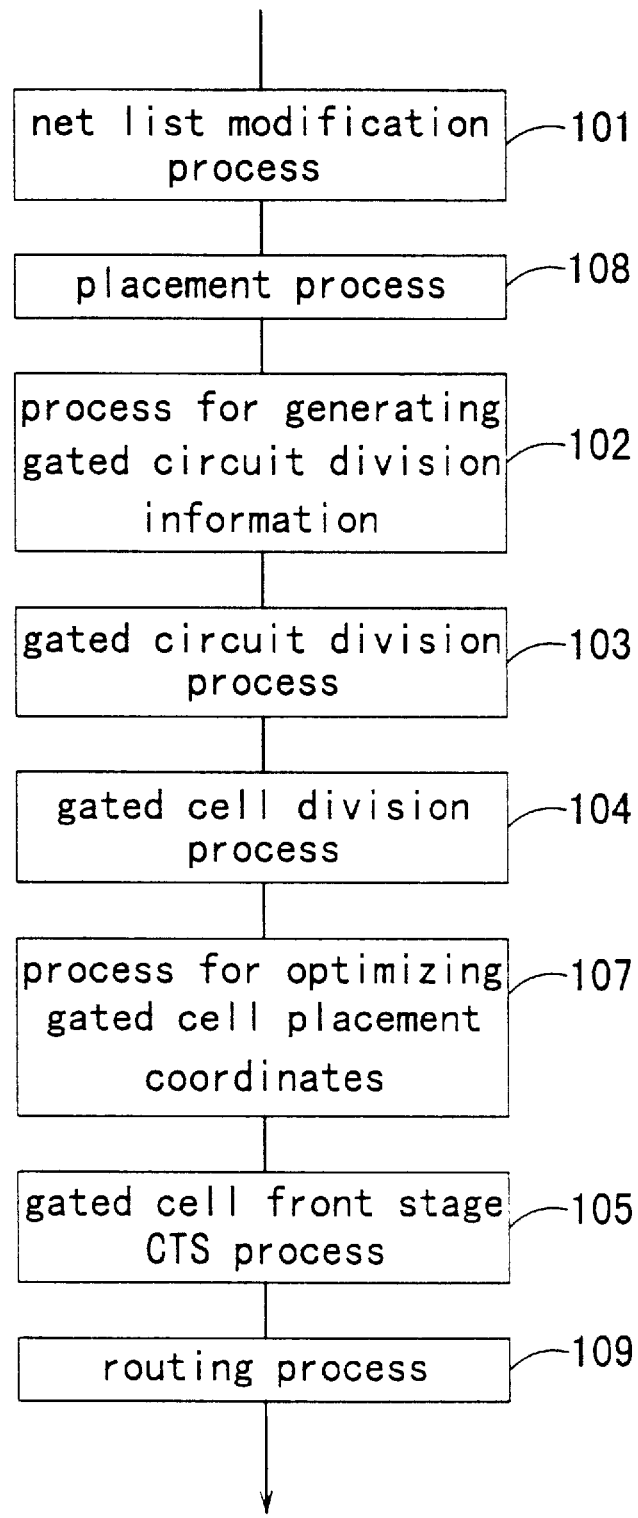
FIG. 3 is a flow chart showing the sixth embodiment according to the present invention.

The sixth embodiment of the present invention is described with reference to FIG. 3.

First, processes from the net list modification process 101 to the gated cell division process 104 are carried out in he same way as the first embodiment and the second embodiment.

In the process 107 for optimizing the gated cell placement coordinates, the total load capacitance of the cluster, to which the gated cell for division of each circuit belongs, is found so as to find the maximum total load capacitance of the cluster. The difference between the maximum total load capacitance of the cluster and the total load capacitance of the cluster to which the gated cell belongs (hereinafter referred to as the capacitance difference) is found for each gated cell for circuit division.

Next, the value gained by subtracting the input capacitance of the buffer cell driving at the gated cell and the wire capacitance between the gated cell and the buffer cell from the drive limit capacitance of each gated cell (hereinafter referred to as spare capacitance) is found.

In the case that the spare capacitance is larger than the capacitance difference, the placement position of the gated cell is moved toward the geometric center or the center of the placement coordinates of all of the gated cells the same wire length distance corresponding to the capacitance value of the capacitance difference according to the Manhattan distance. Here, to move the position according to the Manhattan distance means to move the placement position of the gated cell by an arbitrary distance and in an arbitrary direction by combining the movement in the longitudinal direction and the movement in the lateral direction.

In the case that the spare capacitance is smaller than the capacitance difference, the placement position of the gated cell is moved toward the geometric center or the center of the placement coordinates of all of the gated cell the same wire length distance corresponding to capacitance value of the spare capacitance according to the Manhattan distance.

In the gated cell front stage CTS process 105, a clock tree is generated between the clock source and the gated cell in the same way as in the first embodiment.

In the routing process 109, routing is carried out in the same way as in the first embodiment.

The gated cell may be converted to a cell with a large drive ability in accordance with the capacitance difference so that the placement position of the gated cell may be moved toward the geometric center or the center of the placement coordinates of all of the gated cells the same wire length distance corresponding to the capacitance value of the capacitance difference.

Seventh Embodiment According to claims 10 and 19

The seventh embodiment of the present invention is described with reference to the drawings.

As a result of the process 106 for optimizing gated cell position according to the second embodiment or of the circuit optimization according to the fifth embodiment, a circuit structure is assumed to be generated where the gated cell and the buffer cell as shown in FIG. 29 are connected in series with a ratio of 1 to 1 and/or two or more buffer cells are connected sequentially in series.

In the above cases, the buffer cell is exchanged with a feed-through cell with only wires or the buffer cell is reduced within the range where the skew from the clock source to the flip-flop falls into a desired skew value by adjusting the drive ability of the gated cell AA01 and the buffer cell AB01 in the cluster AH02 to which the gated cell and the buffer cell are connected in series with a ratio of 1 to 1.

Figure 31:
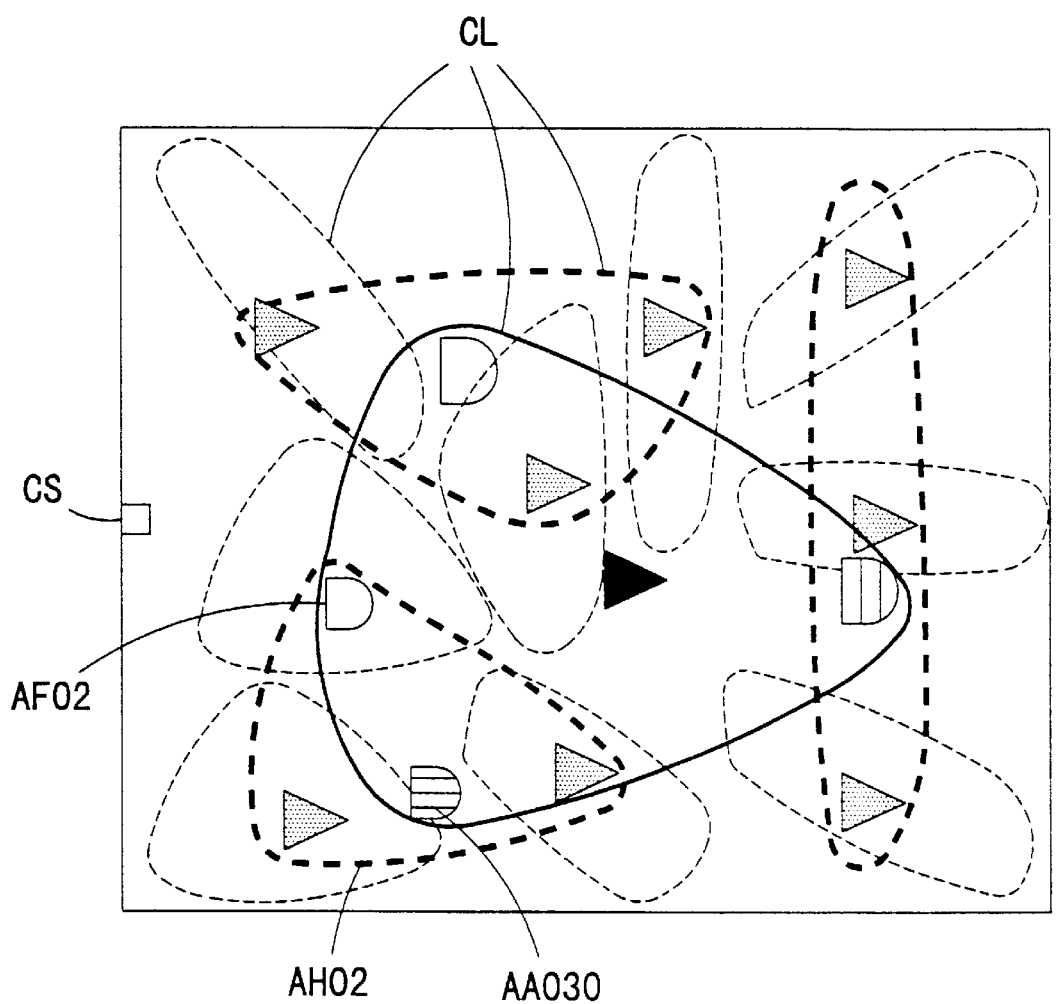
FIG. 31 is a schematic diagram showing the placement result after the skew adjustment of the clock signal of the gated circuit according to the seventh embodiment of the present invention.
Figure 32:
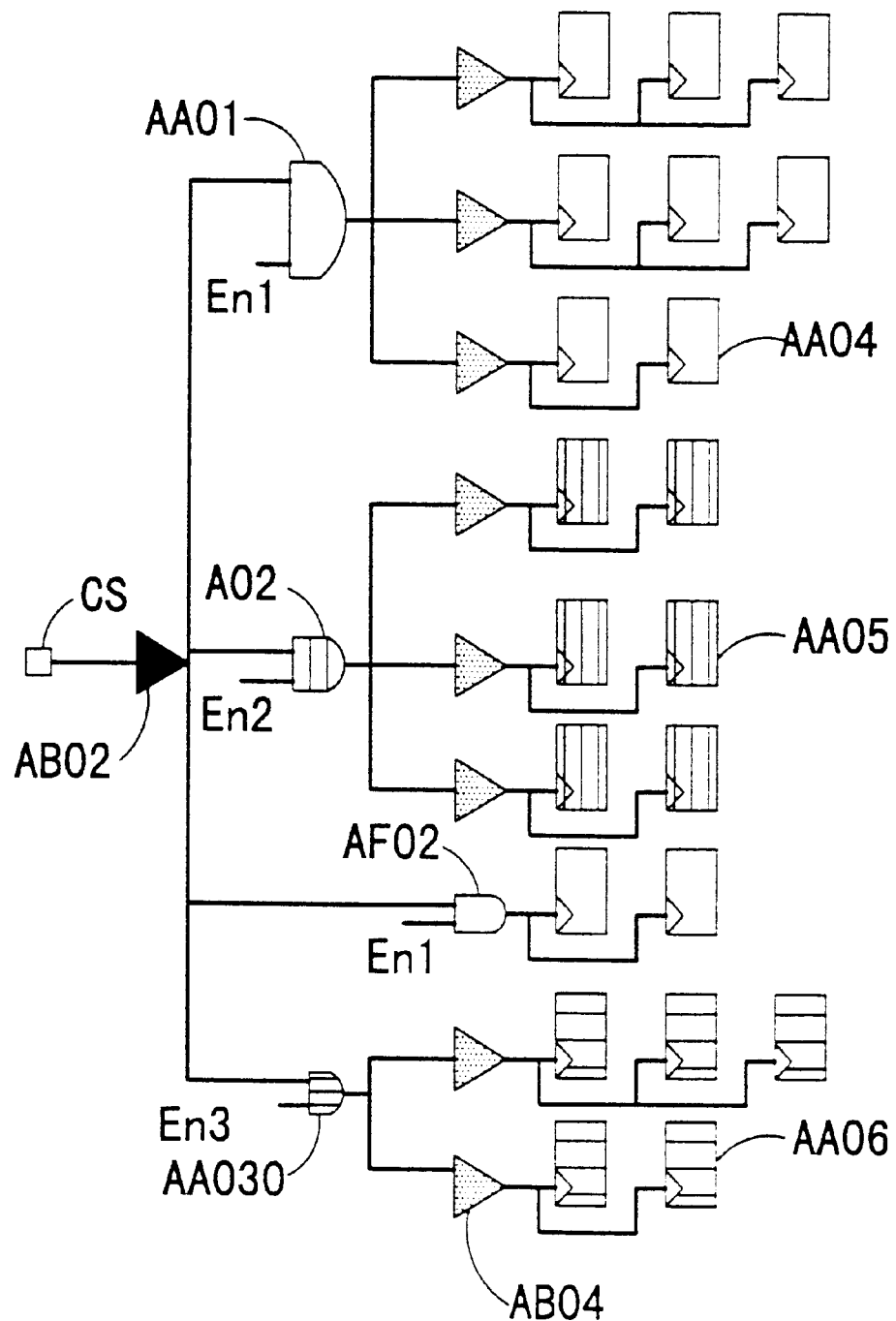
FIG. 32 is a circuit diagram showing a circuit after the skew adjustment of the clock signal of the gated circuit according to the seventh embodiment of the present invention.
Figure 33A:
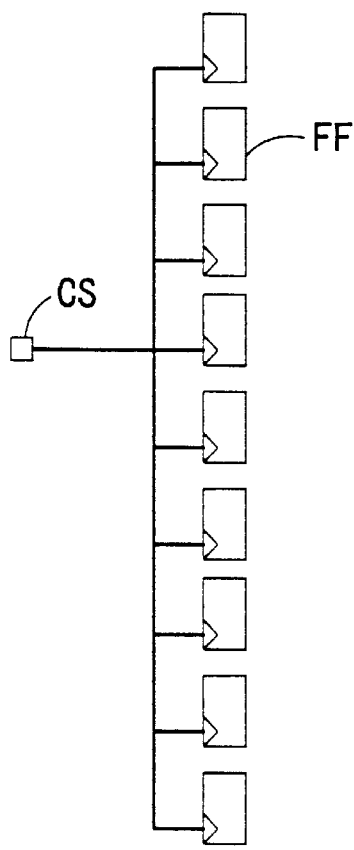
FIG. 33A is a circuit diagram showing a clock circuit structure and a gated clock circuit structure according to a prior art.
Figure 33B:
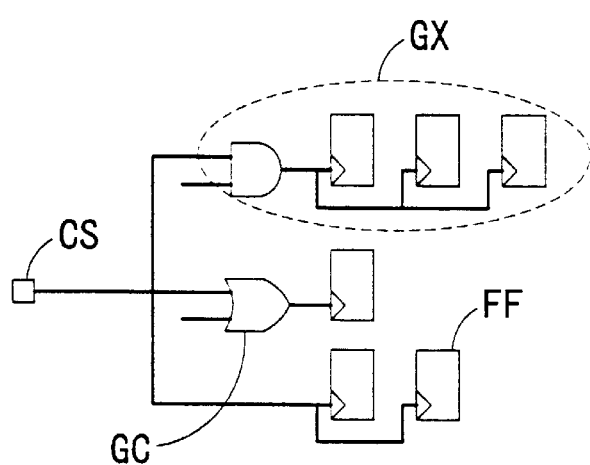
FIG. 33B is a circuit diagram showing a clock circuit structure and a gated clock circuit structure according to a prior art.
Figures 34A, 34B:
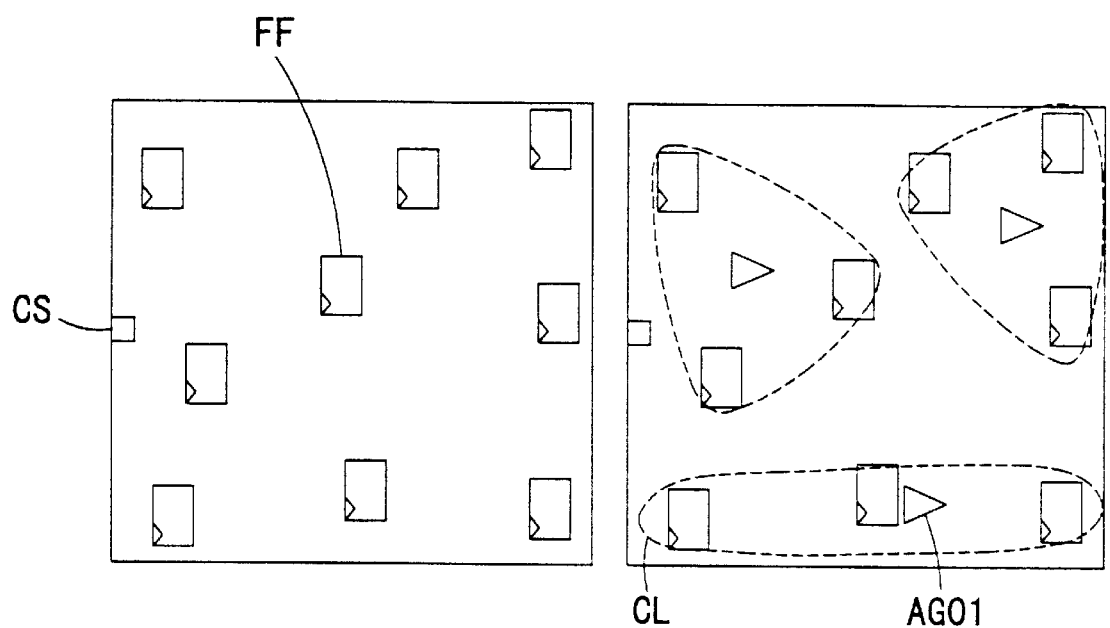
FIG. 34A is a schematic diagram showing the placement result after clustering in accordance with a layout method of a semiconductor integrated circuit device of the "clock tree system" according to prior art.
FIG. 34B is a schematic diagram showing the placement result after clustering in accordance with a layout method of a semiconductor. integrated circuit device of the "clock tree system" according to prior art.
Figure 34C:
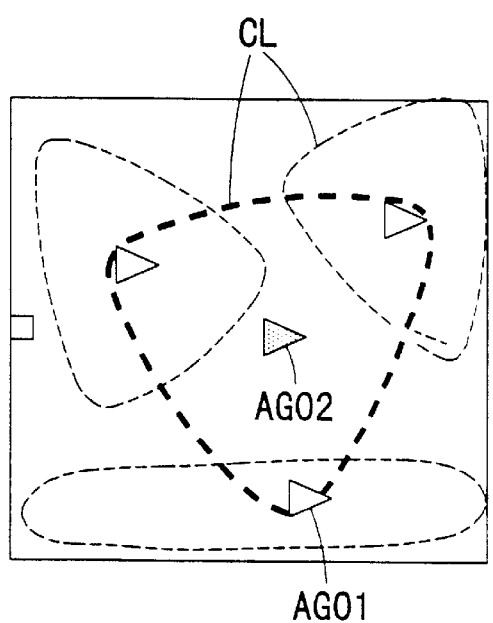
FIG. 34C is a schematic diagram showing the placement result after clustering in accordance with a layout method of a semiconductor integrated circuit device of the "clock tree system" according to a prior art.
Figure 35:
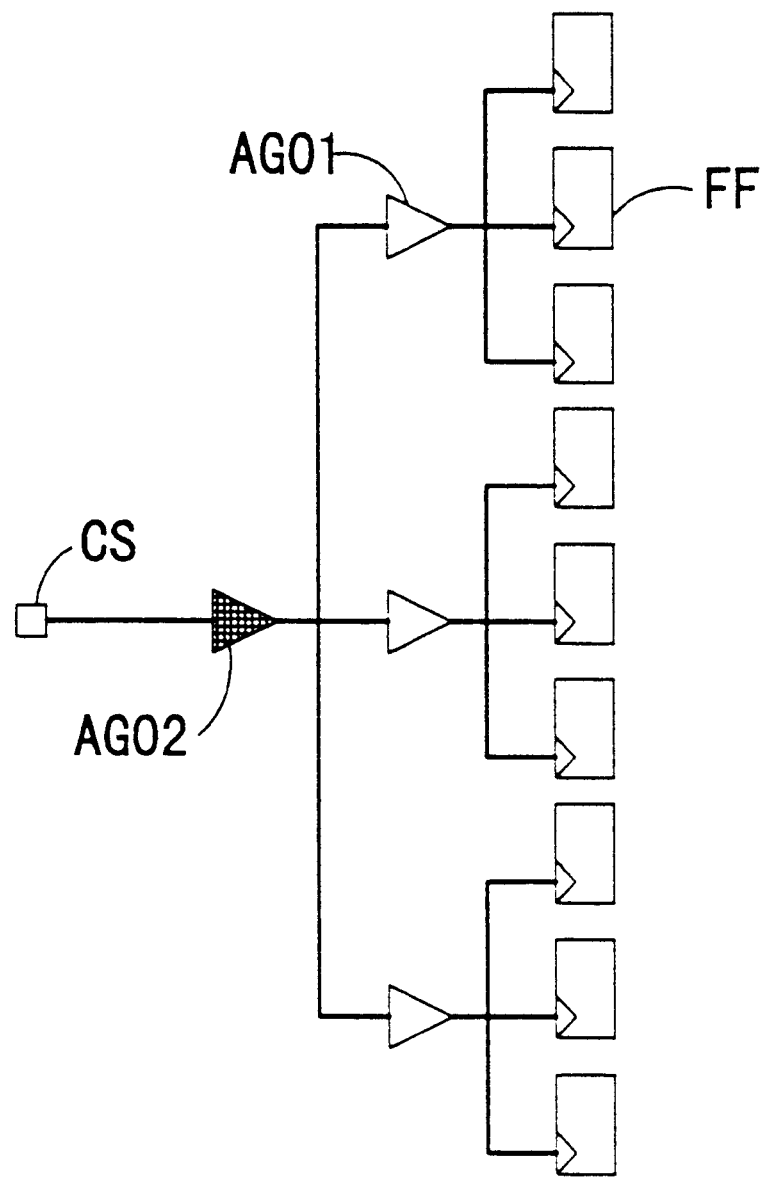
FIG. 35 is a circuit diagram showing a circuit after clustering in accordance with a layout method of a semiconductor integrated circuit device of the "clock tree system" according to a prior art.
Figure 36:
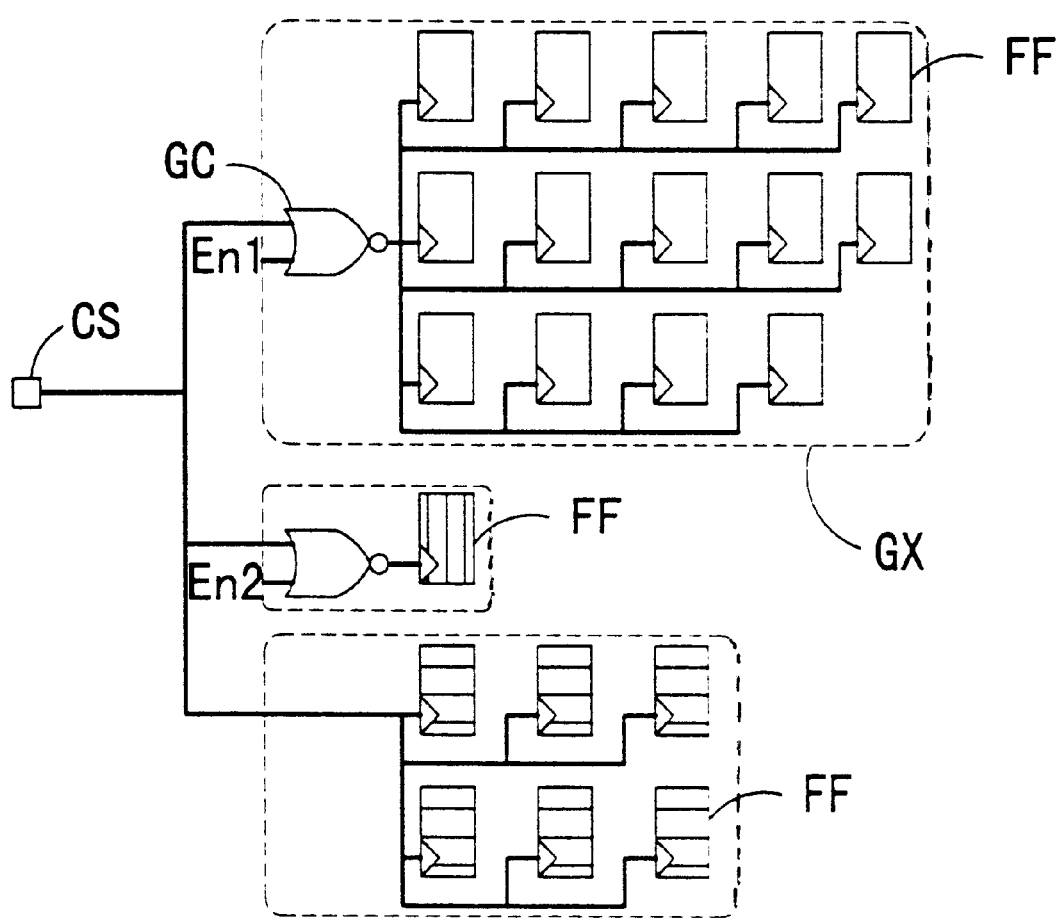
FIG. 36 is a circuit diagram showing a gated clock circuit.
Figure 37:
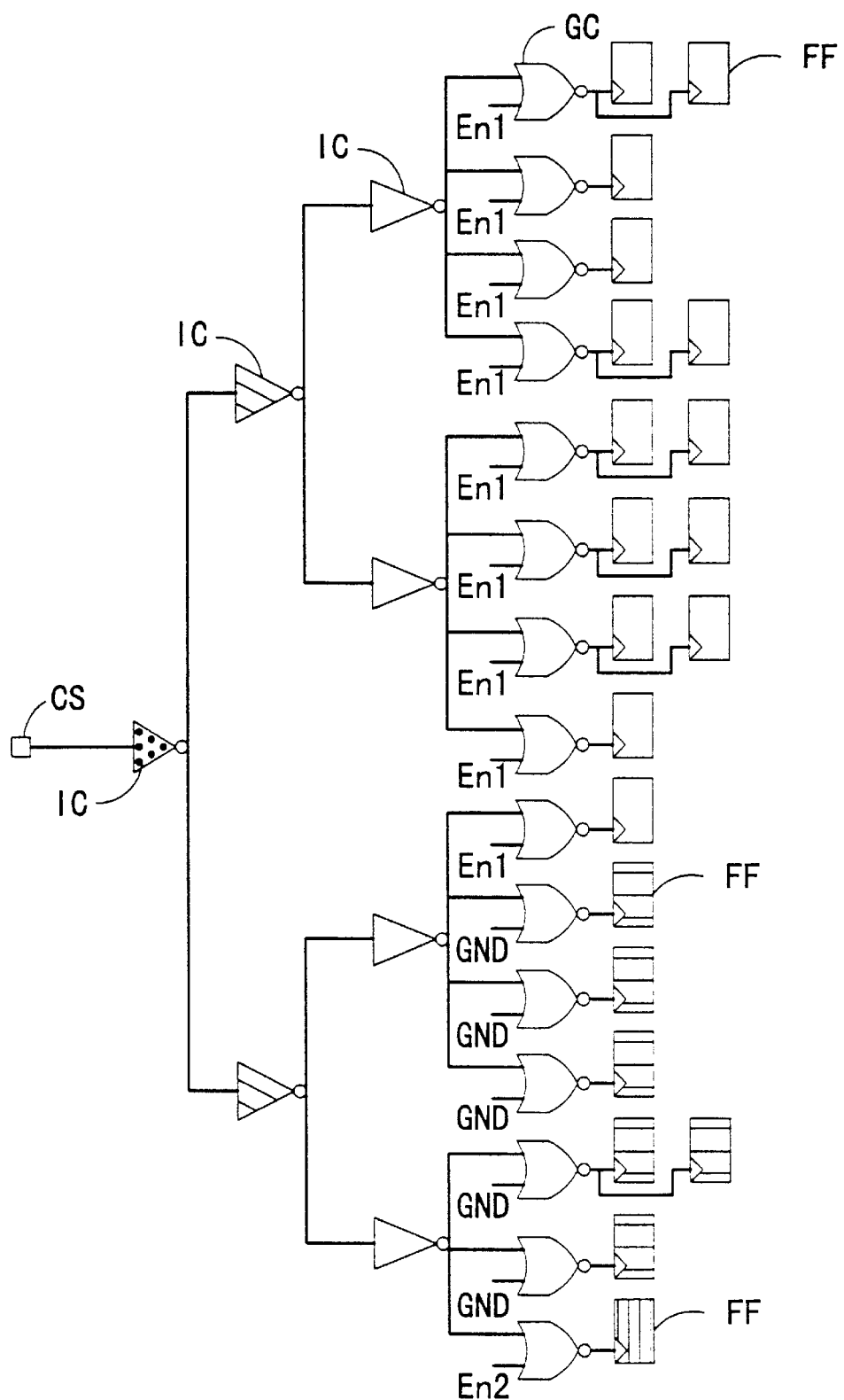
FIG. 37 is a circuit diagram showing a gated clock circuit after implementing a layout method of a semiconductor integrated circuit device to a gated clock circuit according to a prior art.
Figure 39:
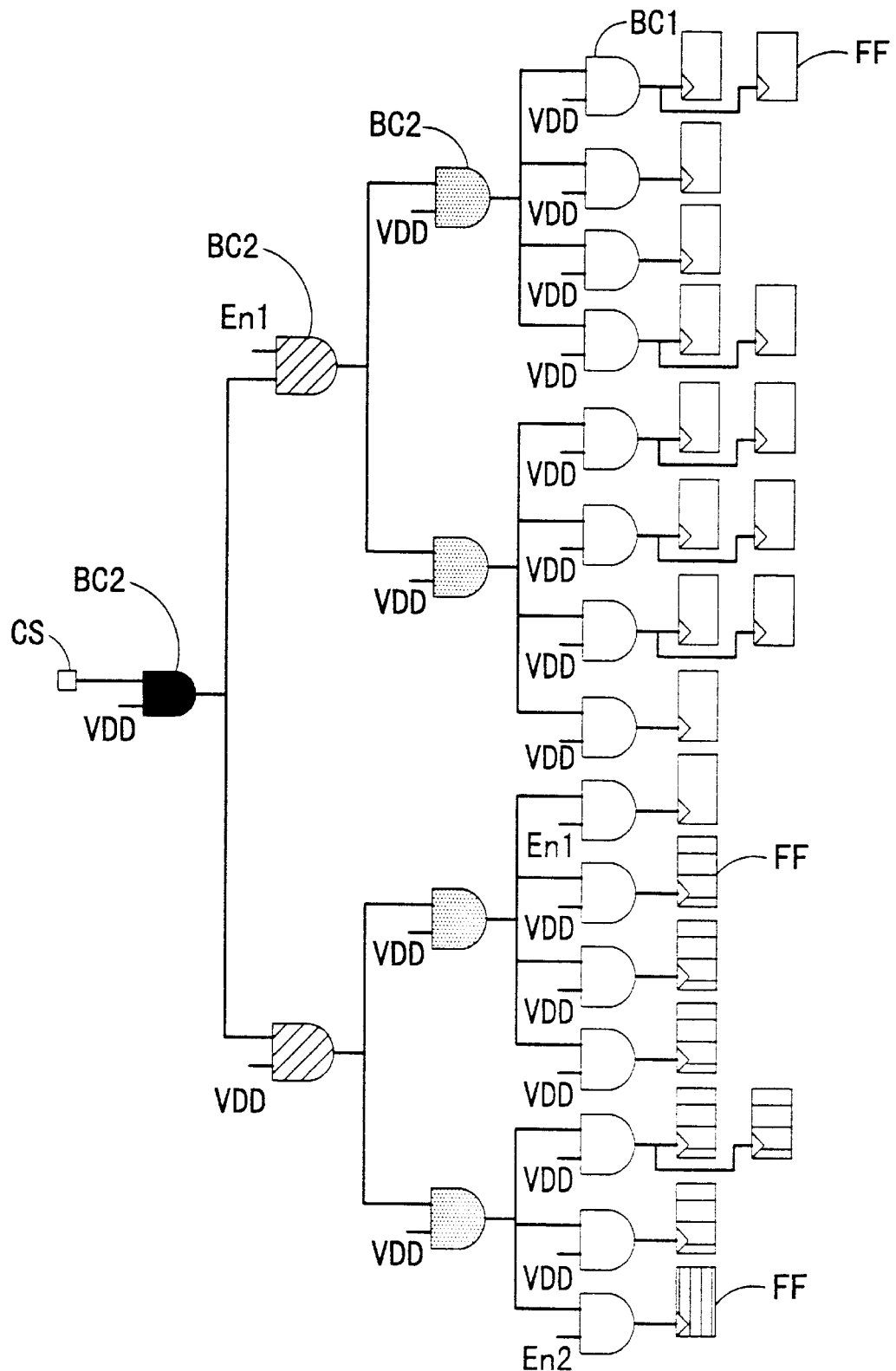
FIG. 39 is a circuit diagram showing a gated clock circuit after implementing a layout method of a semiconductor integrated circuit device to a gated clock circuit according to a prior art.

The placement result after a redundant circuit is reduced is shown in FIG. 31, of which the circuit diagram is shown in FIG. 32. In FIGS. 31 and 32, the reference symbol AF02 shows the gated cell of which the drive ability is adjusted together with the reduction of the buffer cell AA010. A redundant logic circuit forming a clock tree can be reduced and the area or the power consumption of the gated clock circuit can be reduced. The present invention is applicable to the elements which have clock signals as an input such as a latch or a memory other than the flip-flop.

What is claimed is:

1. A semiconductor integrated circuit device layout method for designing a layout of a semiconductor integrated circuit device, said semiconductor integrated circuit device including a gated clock circuit, said gated clock circuit having one gated circuit comprising a gated cell connected to a clock and a first element group connected to a clock source via said gated cell and having a second element group directly connected to said clock source, said method comprising:

a net list change step of changing a net list of said gated clock circuit to a net structure wherein a cell for correcting a stage number is added between said clock source and said second element group in order to handle said second element group as another gated circuit, a gated circuit division information generation step of determining a division number of each of said respective gated circuits so that delay values become equal and of allocating a driving ability of a cell for circuit division for said each respective gated circuit by selecting the driving ability of the cell for circuit division in accordance with the total load capacitance of said each respective gated circuit based on the result of carrying out at least one of an arrangement and an appropriate wiring in accordance with a net list after a change, a gated circuit division step of forming a plurality of clusters by dividing said each respective gated circuit through clustering based on information generated in said gated circuit division information generation step and of respectively inserting cells for circuit division having the driving ability allocated in said gated circuit division information generation step in the positions wherein the load capacitance of said respective clusters becomes equal, a gated cell division step of allocating the same number of gated cells for circuit division as the number of said clusters in said each respective gated circuits, of selecting the driving ability of said gated cell for circuit division so that delay values become equal in accordance with input capacitance of said cells for circuit division and of inserting said each respective gated circuit for circuit division, and a gated cell front stage CTS step for generating a hierarchical tree between said clock source and said respective gated cell for circuit division according to a clock tree system.

2. The semiconductor integrated circuit device layout method according to claim 1, further comprising a gated cell position optimization step of shifting said gated cells for circuit division belonging to the same cluster to a front stage of a cell for clock tree formation positioned on said clock source side from said gated cells for circuit division belonging to said same cluster in the case that the configuration is achieved only by clock nets wherein the inputs of said gated cells for circuit division belonging to the same cluster are all the same, said gated cell position optimization step occurring at a timing of at least one of (a) after said gated cell front stage CTS step and (b) at the time of implementation of said gated cell front stage CTS step.

3. The semiconductor integrated circuit device layout method according to claim 1, wherein said gated cells of said gated clock circuit and said cell for correcting a stage number inserted in said net list change step are, respectively, replaced with inversion cells, of which the logic is inverted, during the period from said net list change step to said gated circuit division information generation step, and wherein a cell that corresponds to an inverter cell is allocated as said cell for circuit division at the time of said gated circuit division information step.

4. The semiconductor integrated circuit device layout method according to claim 1, wherein wiring: capacitances of said respective clusters have an upper limit as a division condition for said each respective gated circuit at a time of said gated circuit division information generation step.

5. The semiconductor integrated circuit device layout method. according to claim 1, further comprising an evaluation function that allows a difference of the load capacitances between said respective clusters and a sum of the load capacitances of said respective clusters to satisfy capacitance values that are set in advance and that at least prioritizes the cluster wherein the types of attributions of the cells forming the cluster are of the minimum and wherein the number of cells of each attribution forming the cluster is large, said,evaluation function occurring at a timing of at least one of (a) clustering in said gated circuit division step and (b) in said gated cell front stage CTS step.

6. The semiconductor integrated circuit device layout method according to claim 5, further comprising adjusting the driving ability of said cells for circuit division that are inserted into said respective clusters.

7. The semiconductor integrated circuit device layout method according to claim 1, further comprising changing net structures by using a set cell with respect to cells for clock tree formation inserted into said respective clusters after clustering and said gated cells for circuit division that form said respective clusters, wherein said set cell is formed of at least one or more first cells having the same logic circuit as said gated cell for circuit division forming said respective clusters and of a second cell that is driven without changing logic and wherein one of the input terminals of said first cells and the input terminal of said second cell are connected to each other.

8. The semiconductor integrated circuit device layout method according to claim 1, further comprising changing net structures by using a circuit with respect to cells for clock tree formation inserted into said respective clusters after clustering and said gated cells for circuit division that form said respective clusters, wherein said circuit is formed of at least one first cell having the same logic circuit as said gated cell for circuit division forming said respective clusters and of a second cell that is driven without changing logic and wherein one of the input terminals of said first cells and the input terminal of said second cell are connected to each other.

9. The semiconductor integrated circuit device layout method according to claim 1, further comprising a gated cell arrangement coordinate optimization step of adjusting an arrangement coordinate of said gated cells for circuit division after said gated cell division step.

10. The semiconductor integrated circuit device layout method according to claim 1, wherein in a case of having a first circuit structure where said gated cells for circuit division and a cell, formed of said cell for circuit division or of said cell for clock tree formation, that is driven without changing logic are connected in series and/or in a case of having a second circuit structure where two or more cells of the same type as said cell that is driven without changing logic are connected in series, said cell that is driven without changing logic in said first circuit structure and/or at least one of said two or more cells that are driven without changing logic in said second circuit structure is/are replaced with a feed through cell or is eliminated within a range wherein a skew from said clock source to each element of said respective element groups has a desired skew value.

11. The semiconductor integrated circuit device layout method according to claim 1, further comprising:

using, at the time of clustering in said gated circuit division step and/or in said gated cell front stage CTS step, an evaluation function that allows the difference of the load capacitances between said respective clusters and the sum of the load capacitances of said respective clusters to satisfy capacitance values that are set in advance, and that at least prioritize the cluster wherein the types of attributions of the cells forming the cluster are of the minimum and wherein the number of cells of each attribution forming the cluster is larger, adjusting the driving ability of said gated cells for circuit division that are inserted into said respective clusters, changing net structures by using one of a set cell and a circuit, with respect to cells for clock tree formation inserted into said respective clusters after clustering and said gated cells for circuit division that form said respective clusters, wherein said one of said set cell and said circuit is formed of at least one or more first cells having the same logic circuit as said gated cell for circuit division forming said respective clusters and of a second cell that is driven without changing logic and wherein one of the input terminals of said first cells and the input terminal of said second cell are connected to each other, and adjusting the arrangement coordinate of said gated cells for circuit division after said gated cell division step, and wherein in a case of having a first circuit structure where said gated cells for circuit division and a first aiding cell, formed of said cell for circuit division or of said cell for clock tree formation, that is driven without changing logic are connected in series and/or in a case of having a second circuit structure where two or more second aiding cells of the same type as said first aiding cell that is driven without changing logic are connected in series, said first aiding cell that is driven without changing logic in said first circuit structure and/or at least one of said two or more second aiding cells that are driven without changing logic in said second circuit structure is replaced with a feed through cell or is eliminated within a range wherein a skew from said clock source to each element of said respective element groups has a desired skew value.

12. The semiconductor integrated circuit device layout method according to claim 2, wherein said gated cells of said gated clock circuit and said cell for correcting a stage number inserted in said net list change step are, respectively, replaced with inversion cells, of which the logic is inverted, during the period from said net list change step to said gated circuit division information generation step, and wherein a cell that corresponds to an inverter cell is allocated as said cell for circuit division at the time of said gated circuit division information generation step.

13. The semiconductor integrated circuit device layout method according to claim 2, where in wiring capacitances of said respective clusters have an upper limit as a division condition for said respective gated circuit at a time of said gated circuit division information generation step.

14. The semiconductor integrated circuit device layout method according to claim 2, further comprising using an evaluation function that allows a difference of the load capacitances between said respective clusters and a sum of the load capacitances of said respective clusters to satisfy capacitance values that are set in advance, and that at least prioritize the cluster wherein the types of attributions of the cells forming the cluster are of the minimum and wherein the number of cells of each attribution forming the cluster is large, wherein said evaluation function is used at a timing of at least one of (a) clustering in said gated circuit division step and (b) said gated cell front stage CTS Step.

15. The semiconductor integrated circuit device layout method according to claim 14, further comprising adjusting a driving ability of said cells for circuit division that are inserted into said respective clusters.

16. The semiconductor integrated circuit device layout method according to claim 2, further comprising changing net structures by using a set cell with respect to cells for clock tree formation inserted into said respective clusters after clustering and said gated cells for circuit division that form said respective clusters, wherein said set cell is formed of at least one first cell having the same logic circuit as said gated cell for circuit division forming said respective clusters and of a second cell that is driven without changing logic and wherein one of the input terminals of said first cells and the input terminal of said second cell are connected to each other.

17. The semiconductor integrated circuit device layout method according to claim 2, further comprising changing net structures by using a circuit with respect to cells for clock tree formation inserted into said respective clusters after clustering and said gated cells for circuit division that form said respective clusters, wherein said circuit is formed of at least one first cell having the same logic circuit as said gated cell for circuit division forming said respective clusters and of a second cell that is driven without changing logic and wherein one of the input terminals of said first cells and the input terminal of said second cell are connected to each other.

18. The semiconductor integrated circuit device layout method according to claim 2, further comprising a gated cell arrangement coordinate optimization step of adjusting an arrangement coordinate of said gated cells for circuit division after said gated cell division step.

19. The semiconductor integrated circuit device layout method according to claim 2, wherein in a case of having a first circuit structure where said gated cells for circuit division and a cell, formed of said cell for circuit division or of said cell for clock tree formation, that is driven without changing logic are connected in series and/or in a case of having a second circuit structure where two or more cells of the same type as said cell that is driven without changing logic are connected in series, said cell that is driven without changing logic in said first circuit structure and/or at least one of said two or more cells that are driven without changing logic in said second circuit structure is replaced with a feed through cell or is eliminated within a range wherein a skew from said clock source to each element of said respective element groups has a desired skew value.

20. The semiconductor integrated circuit device layout method according to claim 2, further comprising:

using an evaluation function that allows a difference of the load capacitances between said respective clusters and a sum of the load capacitances of said respective clusters to satisfy capacitance values that are set in advance, and that at least prioritizes the cluster wherein the types of attributions of the cells forming the cluster are of the minimum and wherein the number of cells of each attribution forming the cluster is large, said evaluation function being used at a timing of at least one of (a) clustering in said gated circuit division step and (b) said gated cell front stage CTS step, adjusting a driving ability of said cells for circuit division that are inserted into said respective clusters, changing net structures by using one of a set cell and a circuit, with respect to cells for clock tree formation inserted into said respective clusters after clustering and said gated cells for circuit division that form said respective clusters, wherein said one of said set cell and said circuit is formed of at least one first cell having the same logic circuit as said gated cell for circuit division forming said respective clusters and of a second cell that is driven without changing logic and wherein one of the input terminals of said at least one first cell and the input terminal of said second cell are connected to each other, adjusting the arrangement coordinate of said gated cells for circuit division after said gated cell division step, and wherein in the case of having a first circuit structure where said gated cells for circuit division and a cell, formed of said cell for circuit division or of said cell for clock tree formation, that is driven without changing logic are connected in series and/or in the case of having a second circuit structure where two or more cells of the same type as said cell that is driven without changing logic are connected in series, said cell that is driven without changing logic in said first circuit structure and/or at least one of said two or more cells that are driven without changing logic in said second circuit structure is replaced with a feed through cell or is eliminated within a range wherein a skew from said clock source to each element of said respective element groups has a desired skew value.

* * * * *